US012751053B2

(12) United States Patent
Su et al.

(10) Patent No.: US 12,751,053 B2
(45) Date of Patent: Sep. 29, 2026

(54) SEMICONDUCTOR DEVICE WITH ENHANCED AVALANCHE RUGGEDNESS

(71) Applicant: TAIWAN SEMICONDUCTOR MANUFACTURING COMPANY LTD., Hsinchu (TW)

(72) Inventors: Liang-Yu Su, Yunlin County (TW); Fu-Yu Chu, Hsinchu City (TW); Ming-Ta Lei, Hsin-Chu City (TW); Ruey-Hsin Liu, Hsinchu City (TW); Yu-Chang Jong, Hsinchu City (TW); Nan-Ying Yang, Hsinchu County (TW); Po-Yu Chiang, Hsinchu City (TW); Yu-Ting Wei, New Taipei City (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 557 days.

(21) Appl. No.: 18/312,819

(22) Filed: May 5, 2023

(65) Prior Publication Data

US 2024/0371926 A1 Nov. 7, 2024

(51) Int. Cl.

| | |
|---|---|
| ***H10D 62/10*** | (2025.01) |
| ***H10D 10/01*** | (2025.01) |
| ***H10D 10/60*** | (2025.01) |
| ***H10D 62/17*** | (2025.01) |

(52) U.S. Cl.

CPC ......... *H10D 62/103* (2025.01); *H10D 10/061* (2025.01); *H10D 10/60* (2025.01); *H10D 62/393* (2025.01)

(58) Field of Classification Search

CPC .... H10D 62/103; H10D 10/061; H10D 10/60; H10D 62/393

See application file for complete search history.

(56) References Cited

U.S. PATENT DOCUMENTS

| | | | | |
|---|---|---|---|---|
| 2004/0051146 A1* | 3/2004 | Ker | H10D 89/813 | 257/356 |
| 2008/0002320 A1* | 1/2008 | Gossner | H10D 89/811 | 361/56 |
| 2009/0067105 A1* | 3/2009 | Lin | H10D 89/811 | 257/357 |

(Continued)

*Primary Examiner* — Syed I Gheyas

(74) *Attorney, Agent, or Firm* — WPAT LAW; Anthony King

(57) ABSTRACT

A method includes: receiving the semiconductor device, wherein the semiconductor device includes: a well region; a doped region; a plurality of gate electrodes; a plurality of source regions; and a plurality of drain regions, wherein the plurality of gate electrodes, the plurality of source region and the plurality of drain regions form a plurality of transistors; and a bulk region disposed in the doped region. A first distance measured between a first transistor of the plurality of transistors and the bulk region is greater than a second distance measured between a second transistor of the plurality of transistors and the bulk region. The method further includes: applying a first voltage to the plurality of drain regions, wherein a first avalanche current generated around the first transistor and shunted through the bulk region is greater than a second avalanche current generated around the second transistor and shunted through the bulk region.

20 Claims, 21 Drawing Sheets

(56) References Cited

U.S. PATENT DOCUMENTS

| | | | | |
|---|---|---|---|---|
| 2014/0159206 | A1* | 6/2014 | Hsu | H10D 89/813<br>438/514 |
| 2018/0151554 | A1* | 5/2018 | Peng | H10D 89/815 |

* cited by examiner

SEMICONDUCTOR DEVICE WITH ENHANCED AVALANCHE RUGGEDNESS

BACKGROUND

Electronic equipment involving semiconductor devices are essential for many modern applications. Technological advances in materials and design have produced generations of semiconductive devices where each generation has smaller and more complex circuits than the previous generation. In the course of advancement and innovation, functional density (i.e., the number of interconnected devices per chip area) has generally increased while geometric size (i.e., the smallest component that can be created using a fabrication process) has decreased. Such advances have increased the complexity of processing and manufacturing semiconductive devices.

As technologies evolve, designs for devices become more complicated to meet the requirements of smaller dimensions, functionality improvement and the increased amount of circuitries. The demand of operating voltages and currents, e.g., in power-related circuits, is also increased. The manufacturing of a semiconductor device becomes more challenging to deal with the deficiencies such as insufficient reliability. Therefore, there is a continuous need to improve the structure and manufacturing method of the semiconductor devices in order to enhance device reliability, e.g., to withstand device breakdown, under a high operating voltage while maintaining device performance.

BRIEF DESCRIPTION OF THE DRAWINGS

Aspects of the embodiments of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

DETAILED DESCRIPTION

Figure 1A:
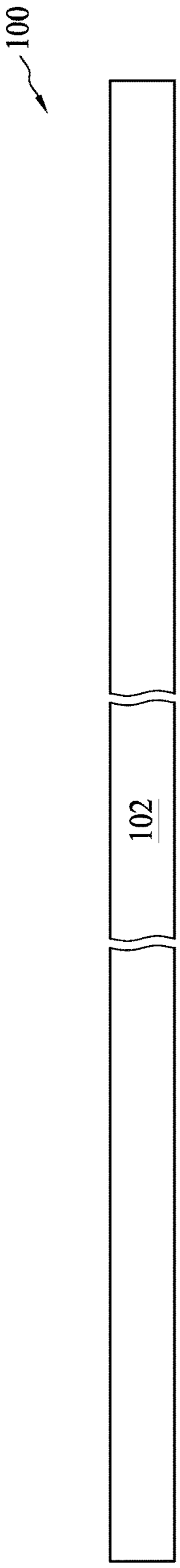
FIGS. 1A to 1O are cross-sectional views of intermediate stages of a method of forming a semiconductor device, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the deviation normally found in the respective testing measurements. Also, as used herein, the terms "about," "substantial" or "substantially" generally mean within 10%, 5%, 1% or 0.5% of a given value or range. Alternatively, the terms "about," "substantial" or "substantially" mean within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "about," "substantial" or "substantially." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

Embodiments of the present disclosure discuss a method of forming and operating a semiconductor device operable to function properly when biased at a high and short breakdown voltage (voltage spike). In a modern semiconductor device design, a voltage range is generally defined, within which the semiconductor device can function properly without causing damage, e.g., permanent breakdown, to the semiconductor device. Such voltage range is usually referred to herein as a safe operation area (SOA). A greater range of the SOA often requires greater device footprint, and thus results in higher manufacture cost. As the semiconductor device is manufactured with a continuously requirement to reduce its size while maintaining the device performance, the issues of maintaining a sufficient range of the SOA and a reduced device size at the same time may impose challenges to the design and manufacturing of modern semiconductor devices.

To address the above issues, the present disclosure proposes a structure and a forming method of a semiconductor device which can withstand higher breakdown voltage without increasing the existing device size. The semiconductor device is designed such that at least one parasitic bipolar junction transistor (BJT) with a sufficiently large base resistance is embedded in the semiconductor device. In an operating scenario where the semiconductor device is biased at a high reversed voltage close to the breakdown voltage for a short period, the large amount of hot electrons generated with avalanche current under the reversed voltage can bias the base terminal of the parasitic BJT at a high voltage, thereby turning on the parasitic BJT. The avalanche current resulting from the breakdown voltage can be shunted to a bulk region of the semiconductor device through the collector terminal of the parasitic BJT, and the potential damage of the large avalanche current on the semiconductor device can be mitigated or reduced. As a result, the semiconductor device can restore to a normal operation condition safely after the short period of reversed voltage, and the actual breakdown voltage can be further increased. Therefore, the device performance can be enhanced without paying the price of an additional device area.

Figure 1B:
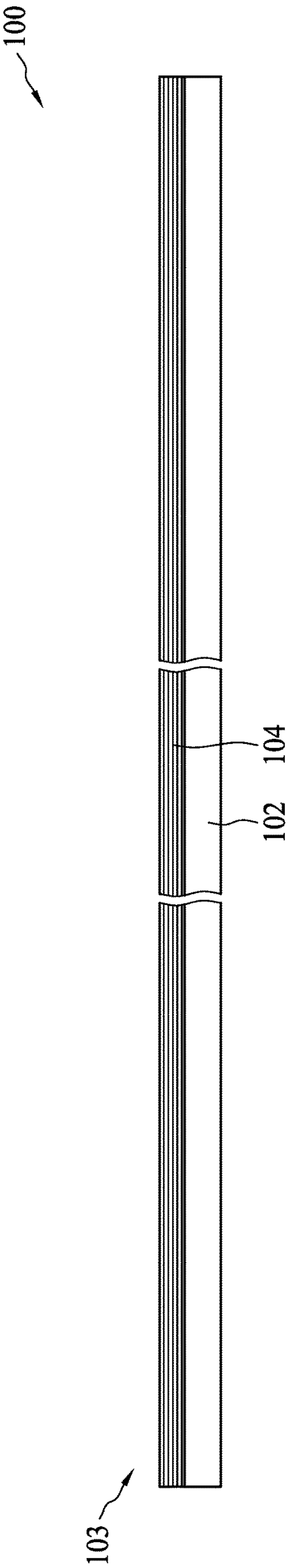
Figure 1C:
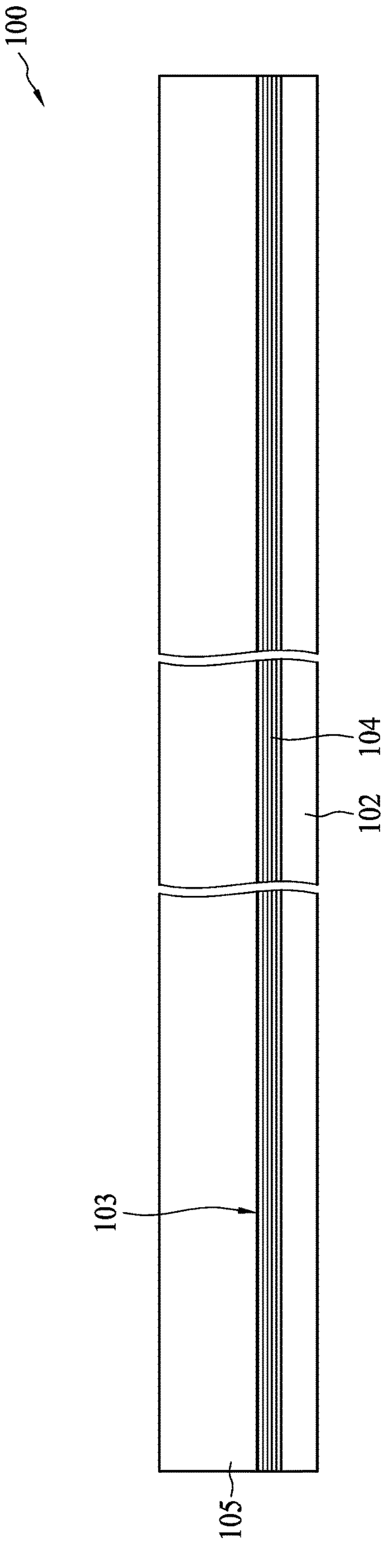
Figure 1D:
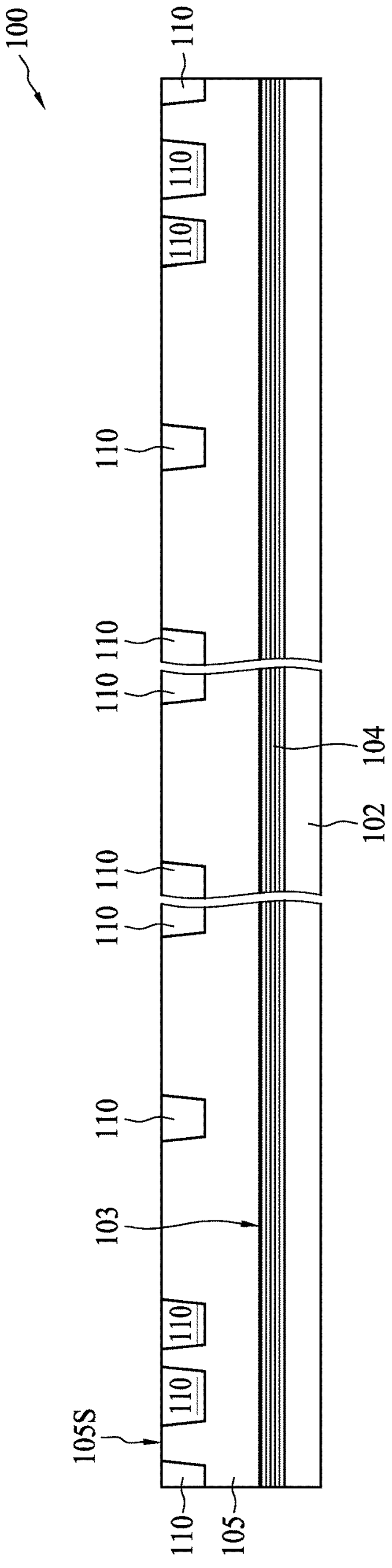
Figure 1E:
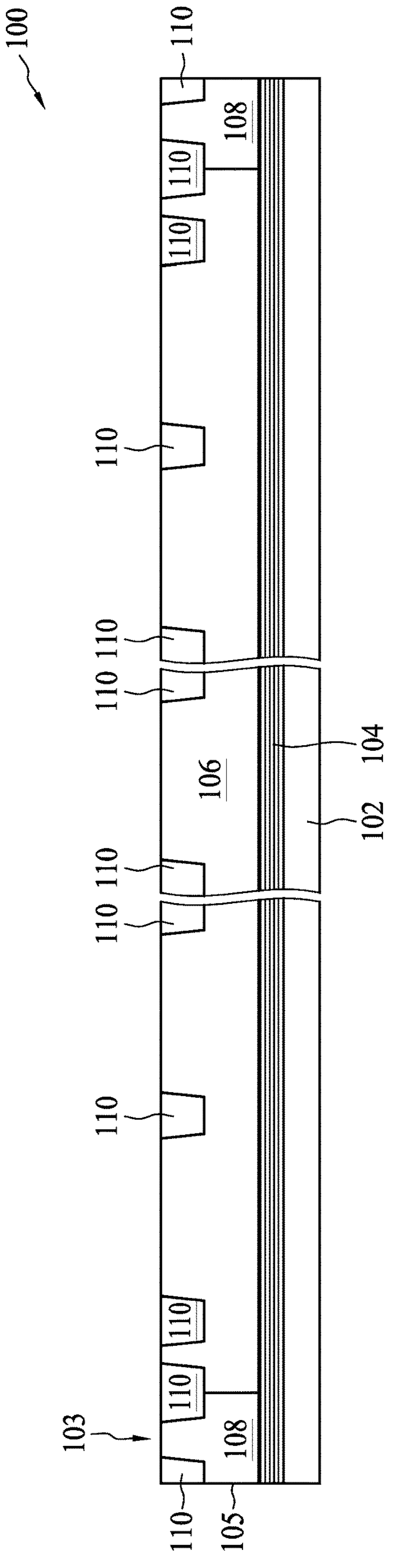
Figure 1F:
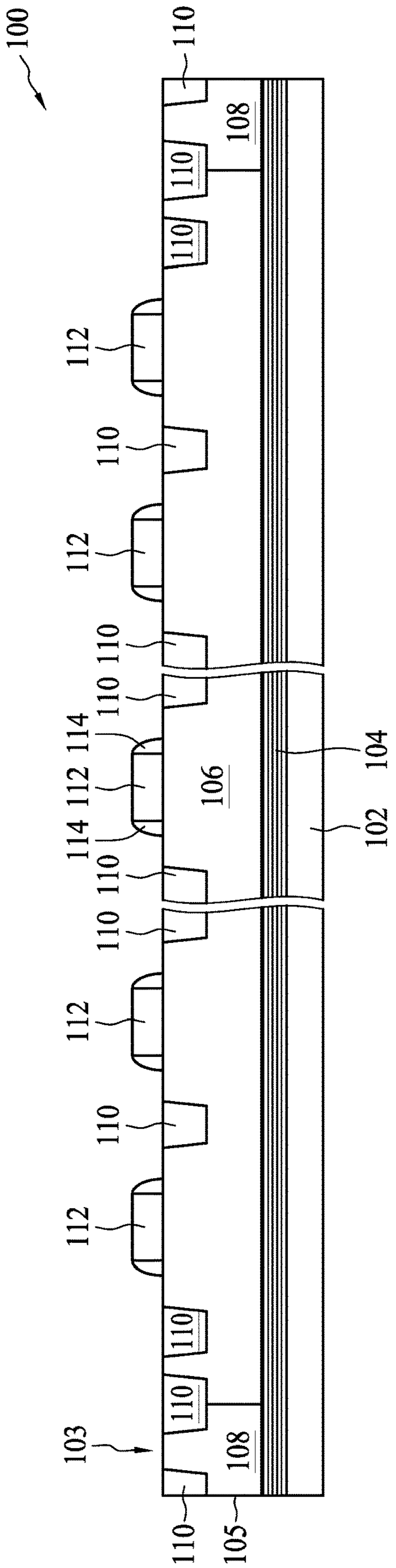
Figure 1G:
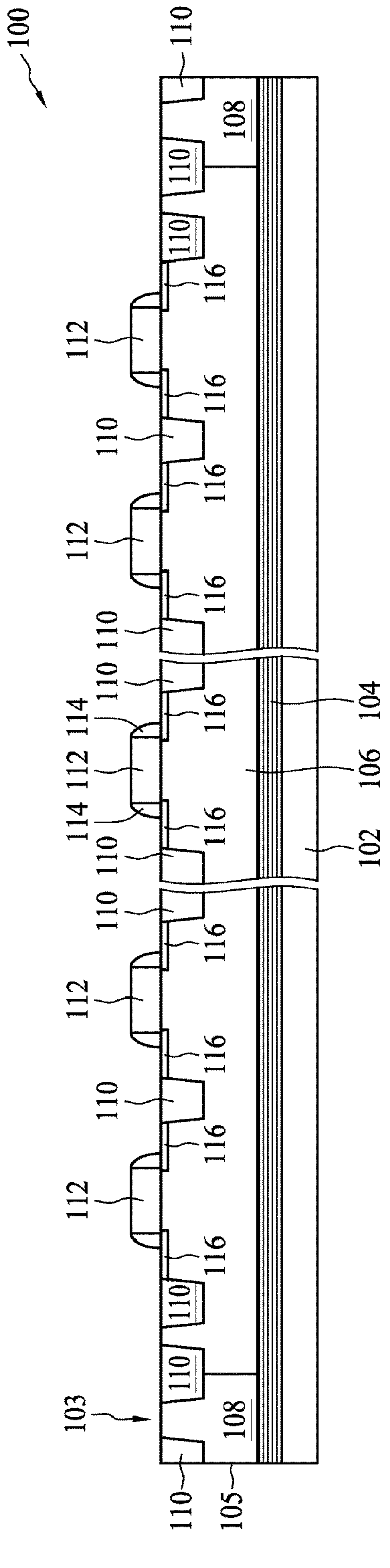
Figure 1H:
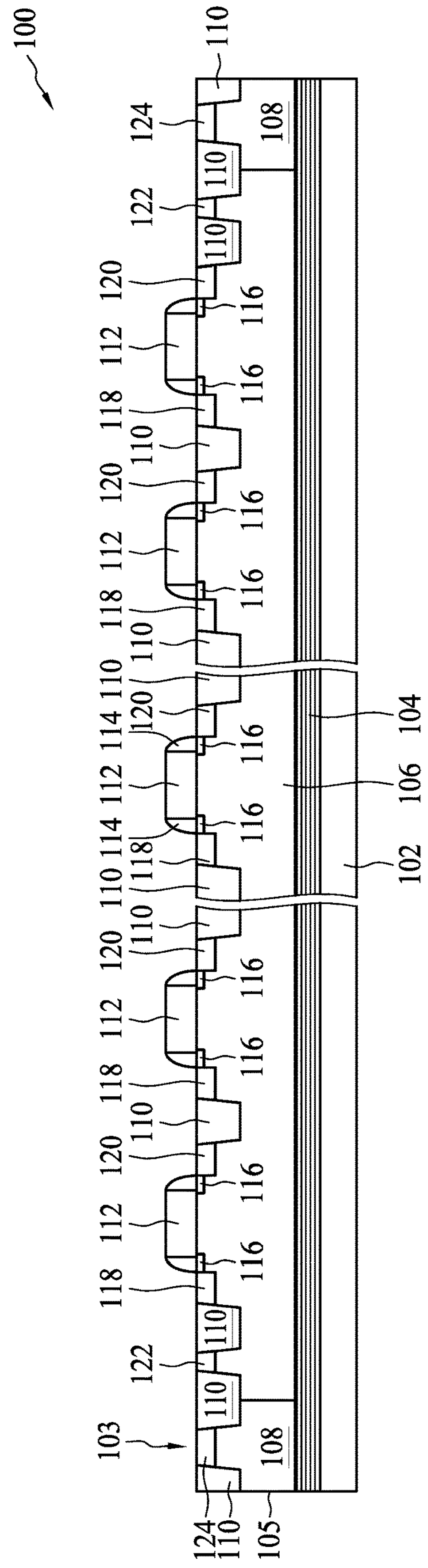
Figure 1I:
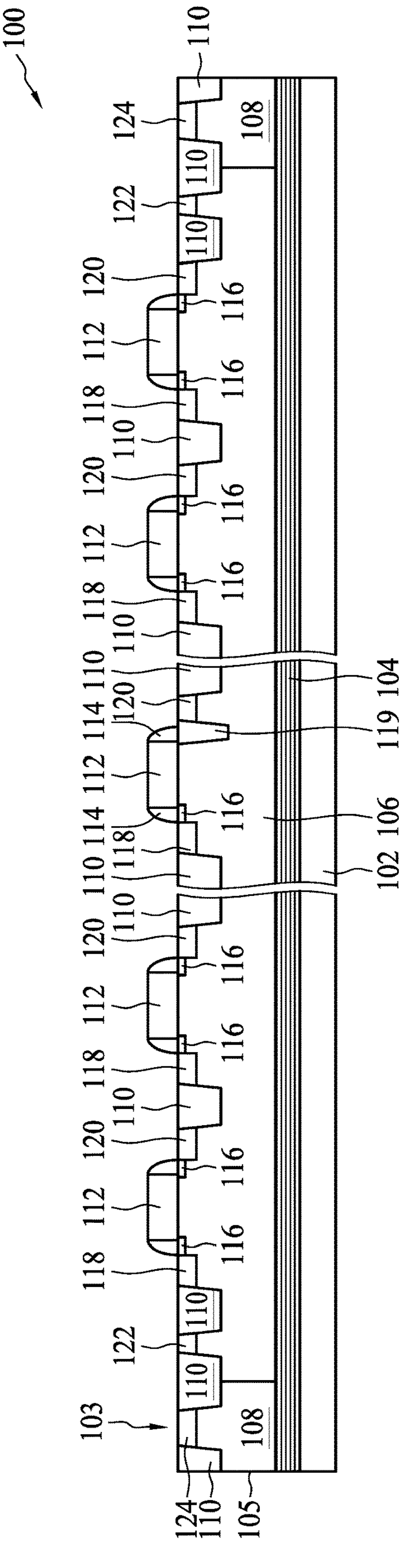
Figure 1J:
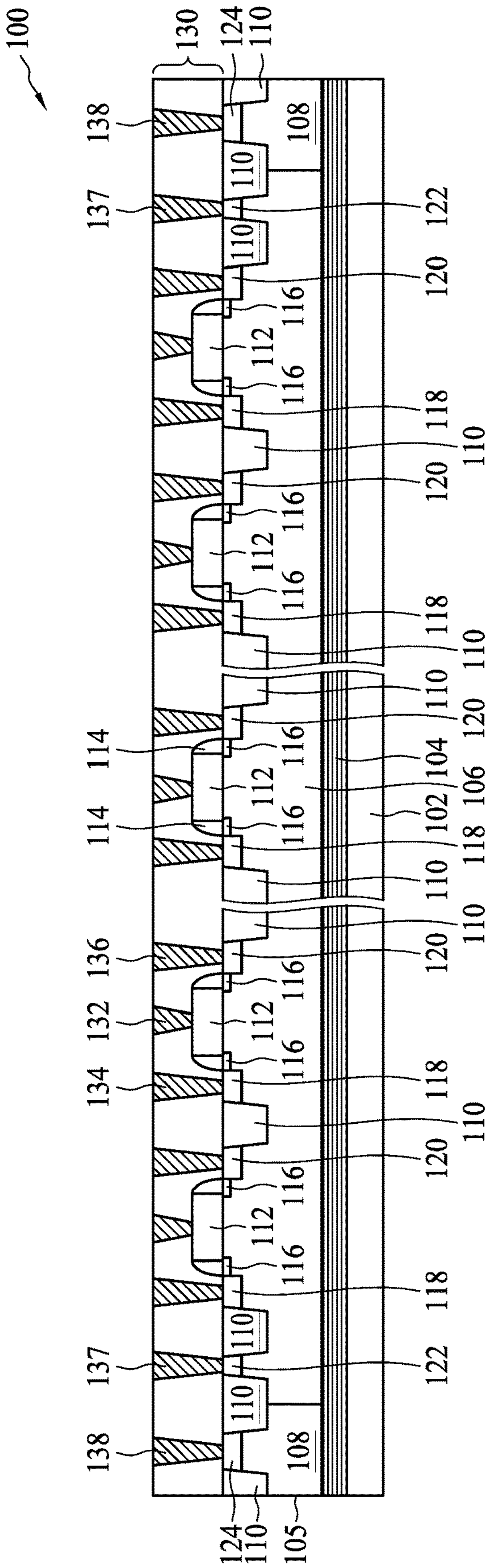
Figure 1K:
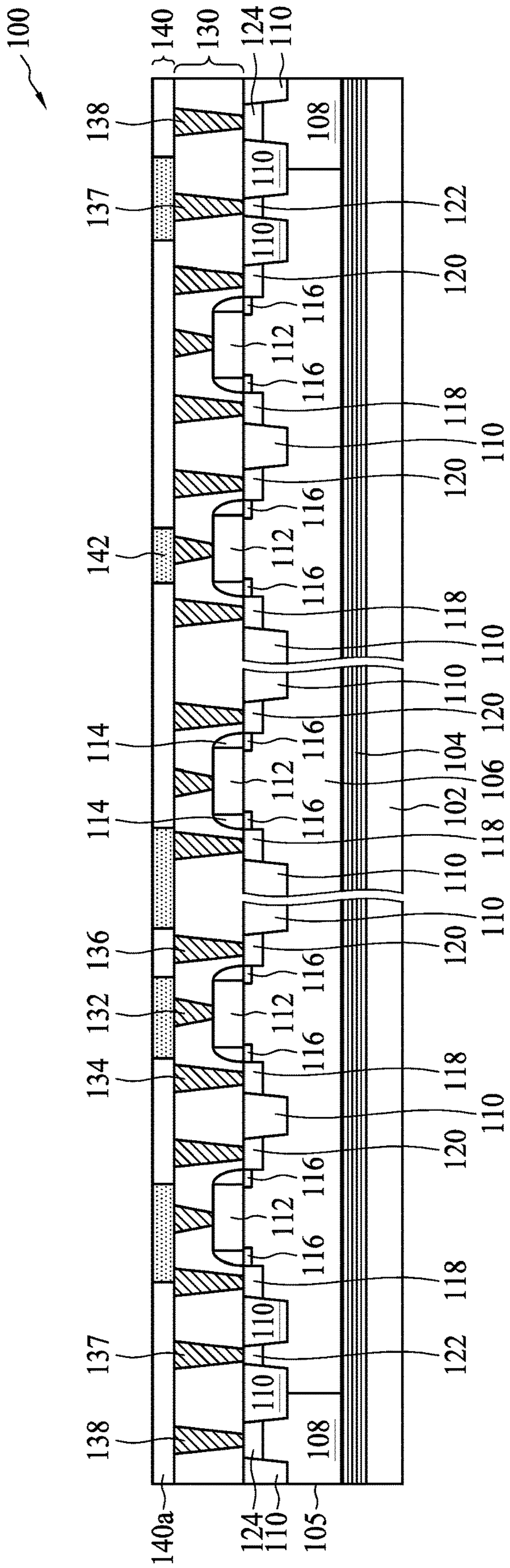
Figure 1L:
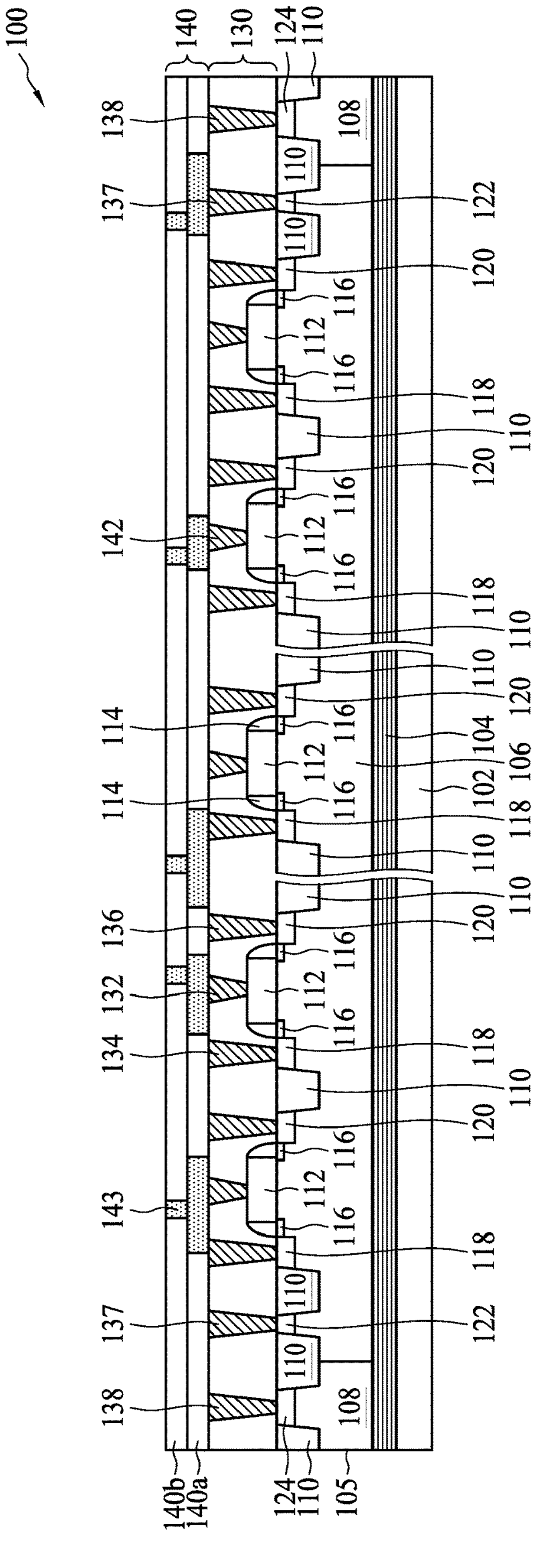
Figure 1M:
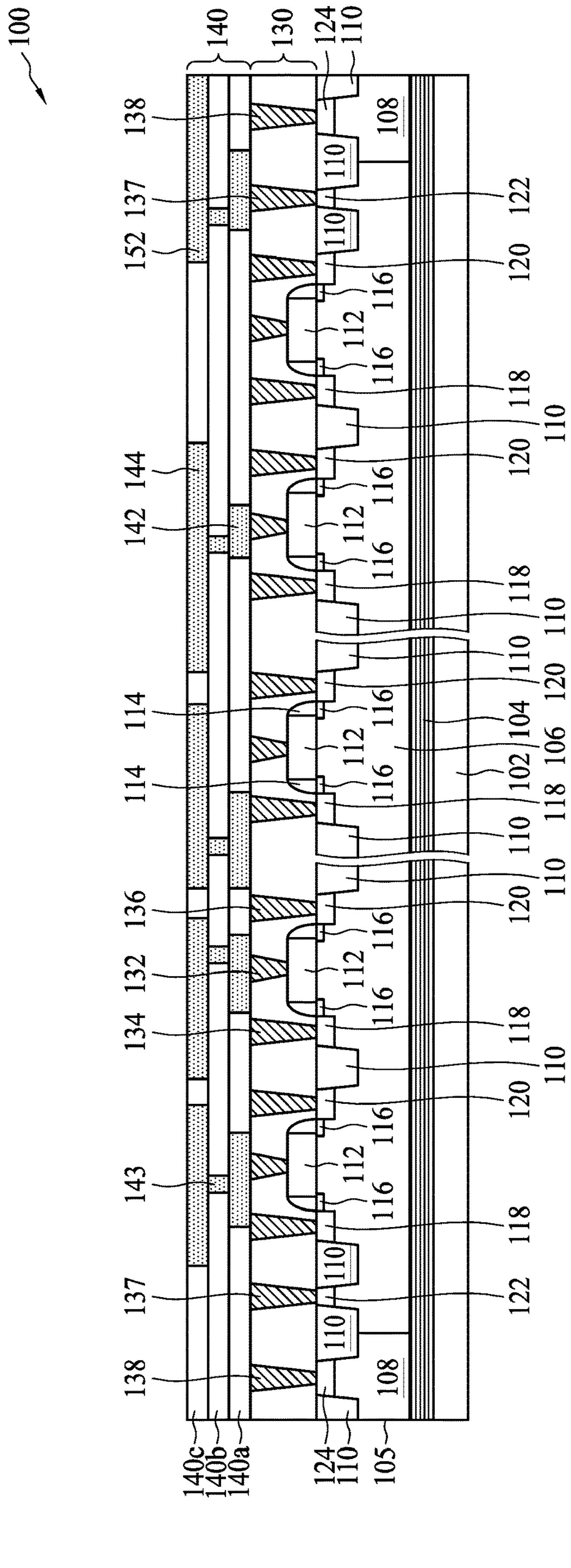
Figure 1N:
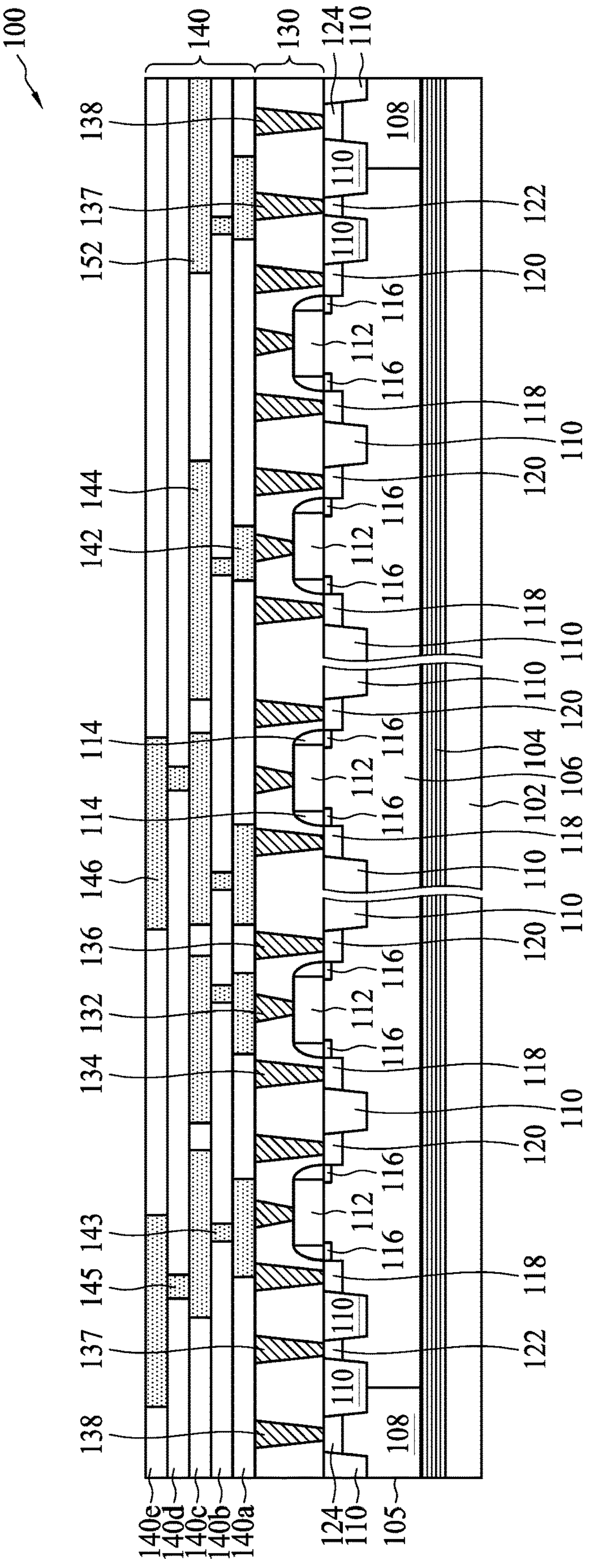
Figure 1O:
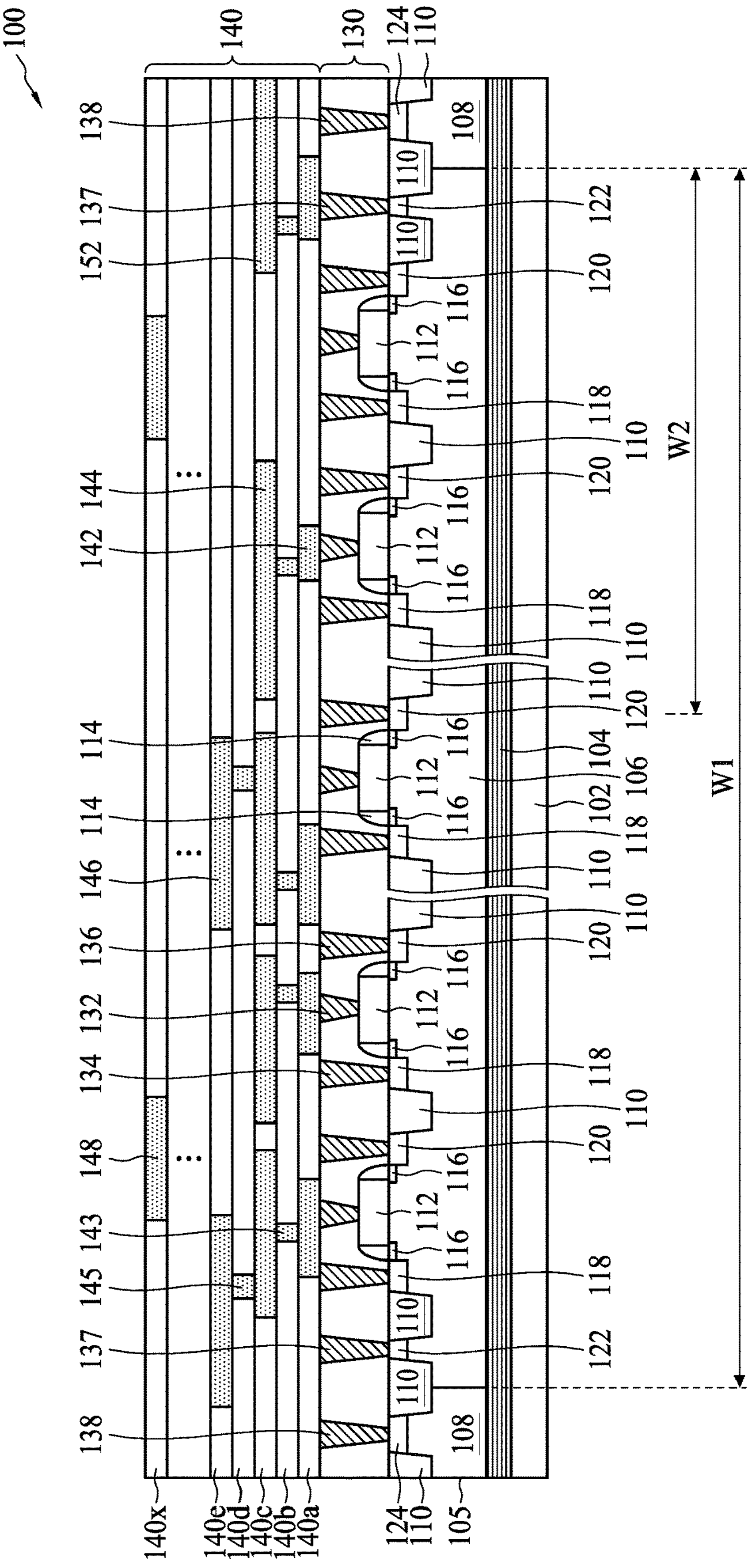

FIGS. 1A to 1O are cross-sectional views of intermediate stages of a method of forming a semiconductor device 100, in accordance with some embodiments of the present disclosure. It shall be understood that additional steps can be provided before, during, and after the steps in FIGS. 1A to 1O, and some of the steps described below can be replaced with other embodiments or eliminated. The order of the steps shown in FIGS. 1A to 1O may be interchangeable. Some of the steps may be performed concurrently or independently.

According to some embodiments, the semiconductor device 100 includes metal-oxide semiconductor (MOS) field-effect transistors (FET). According to some embodiments, at least one terminal, e.g., a drain terminal, of the MOSFET of the semiconductor device 100 is biased at a time-varying voltage, where the time-varying voltage may result from an inductor or other components. According to some embodiments, the semiconductor device 100 is part of a power switching device or other analog devices. According to some embodiments, when breakdown occurs, the voltage of the at least one terminal of the semiconductor device 100 may be driven out of the range of SOA for a short period, e.g., in the order of nanoseconds. A large amount of avalanche current may be generated during the short period and may damage the semiconductor device.

Referring to FIG. 1A, a substrate 102 is provided or formed. According to some embodiments, the substrates 102 includes semiconductor material such as bulk silicon. According to some embodiments, the substrate 102 includes other semiconductor materials, such as silicon germanium, silicon carbide, gallium arsenide, or the like. In the present embodiment, the substrate 102 is a P-type semiconductive substrate (acceptor type). In some other embodiments, an N-type semiconductive substrate (donor type) 102 can be used. Alternatively, the substrate 102 includes another elementary semiconductor, such as germanium; a compound semiconductor including gallium arsenic, gallium phosphide, indium phosphide, indium arsenide, or indium antimonide; an alloy semiconductor including SiGe, GaAsP, AlInAs, AlGaAs, GaInAs, GaInP, or GaInAsP; or combinations thereof. In yet another embodiment, the substrate 102 includes portions to form a semiconductor-on-insulator (SOI) substrate. In other alternatives, the substrate 102 may include a doped epitaxial layer, a gradient semiconductor layer, and/or a semiconductor layer overlaying another semiconductor layer of a different type, such as a silicon layer on a silicon germanium layer.

A barrier layer 104 is formed in the substrate 102, as shown in FIG. 1B. The barrier layer 104 is formed in an upper portion of the substrate 102. The barrier layer 104 is also referred to herein as a buried layer. Furthermore, the barrier layer 104 is configured as an isolation layer such that noise resulting from different circuits arranged in other areas (not shown) of the substrate 102 may be shielded by the barrier layer 104. Thus, the electrical performance of the semiconductor device 100 may be ensured. In an embodiment, the barrier layer 104 is a doped region doped with a different conductivity type than the semiconductor substrate 102. For example, the barrier layer 104 is doped with an N-type dopant in a P-type semiconductor substrate 102. According to some embodiments, the barrier layer 104 is part of a well region 103.

According to some embodiments, the barrier layer 104 is formed by an ion implantation operation. The implantation dose and power are dependent upon the predetermined thickness of the barrier layer 104. According to some embodiments, a patterned mask layer (not separately shown) is formed over the substrate 102 to expose an area of the semiconductor device 100 while covering the other areas. The dopants, e.g., an N-type dopant such as arsenic, phosphorus, or the like, are implanted into substrate 102 with the patterned mask layer as an implantation mask. According to some embodiments, after the ion implantation operation is completed, the pattern mask layer is stripped or removed.

Referring to FIG. 1C, an epitaxial layer 105 is formed over the barrier layer 104. According to some embodiments, the epitaxial layer 105 covers the entire barrier layer 104. The epitaxial layer 105 may be formed by epitaxy, such as molecular beam epitaxy (MBE), selective epitaxial growth (SEG), or the like.

Referring to FIG. 1D, a plurality of isolation regions 110 are formed on the upper surface 105S of the epitaxial layer 105. The isolation regions 110 may include electrically insulating materials or dielectric materials, such as silicon oxide; however, other dielectric materials, e.g., silicon nitride, silicon oxynitride, silicon carbide, or the like, are also possible for forming the isolation regions 110. According to some embodiments, the isolation regions 110 are referred to as shallow trench isolation (STI) regions.

In an example procedure of forming the isolation regions 110, a plurality of trenches (not separately shown) are etched from the upper surface 105S of the epitaxial layer 105. The trenches may have substantially equal depths measured from the upper surface 105S. The trenches may be formed using a dry etch, a wet etch, a reactive ion etch (RIE), a combination thereof, of the like. The trenches are filled with the dielectric materials to form the isolation regions 110 using, e.g., chemical vapor deposition (CVD), physical vapor deposition (PVD), atomic layer deposition (ALD), oxidation, nitridation, in-situ steam generation (ISSG), spin-on coating, or other suitable deposition methods.

After the dielectric material of the isolation region 110 fills the trenches, a planarization operation, e.g., chemical mechanical polishing (CMP) or mechanical grinding, may be adopted to remove excess dielectric materials over the upper surface 105S and level the surface of the isolation regions 110 with the upper surface 105S.

According to some embodiments, the isolation regions 110 are formed within the semiconductor device 100, e.g., at the boundary of different doped regions or well regions in the semiconductor device 100. The isolation regions 110 are also configured to electrically isolate the semiconductor device 100 from adjacent semiconductor devices.

Referring to FIG. 1E, a doped region 106 are formed in the epitaxial layer 105 over the barrier layer 104. According to some embodiments, the barrier layer 104 overlaps the entire the doped region 106. According to some embodiments, the doped region 106 includes an N-type dopant. The doped region 106 may be formed using an ion implantation operation. The depth and profile of the doped region 106 are controlled by the recipes of the ion implantation operation. According to some embodiments, the ion implantation operation may use N-type dopants with an implant dose in a range between about $1\times10^{10}$ and about $1\times10^{18}$ atoms/cm$^2$.

According to some embodiments, doped regions 108 are formed in the epitaxial layer 105 adjacent to the doped region 106. The doped regions 108 may form a ring with a dopant type, e.g., N-type, the same as the dopant type of the doped region 106. The doped regions 108 may laterally surround the doped region 106. According to some embodiments, the doped regions 108 are connected to the underlying barrier layer 104 to form the well region 103. According to some embodiments, the well region 103 formed of the barrier layer 104 and the doped regions 108 surrounds the doped region 106 from the lower side and lateral sides of the doped region 106. The doped regions 108 may be formed using an ion implantation operation. The depth and profile of the doped regions 108 are controlled by the recipes of the ion implantation operation. According to some embodiments, the ion implantation operation may include an implant dose in a range between about $1\times10^{10}$ and about $1\times10^{18}$ atoms/cm$^2$. The doping concentration of the doped regions 108 may be greater than or substantially equal to the doping concentration of the doped region 106.

FIG. 1F illustrates the formation of gate electrodes 112. The gate electrodes 112 may be separated from each other and parallel to each other. The gate electrodes 112 may include a conductive material, e.g., doped silicon. The gate electrodes 112 may include dopants, e.g., P-type dopants or N-type dopants implanted in the polysilicon. According to some other embodiments, the gate electrodes 112 include metallic materials. In the present embodiment, the gate electrodes 112 serve as the multiple gate terminals of the semiconductor device 100.

According to some embodiments, the semiconductor device 100 further includes a gate dielectric layer (not separately shown) between the doped region 106 and each of the gate electrodes 112. The gate dielectric layer may include a dielectric material, such as silicon oxide, silicon nitride, silicon oxynitride, or a high-k dielectric material. As an example formation process, a gate dielectric material is deposited in a blanket layer over the doped region 106 and the doped region 108. A conductive material, e.g., polysilicon, is subsequently deposited over the gate dielectric material. The deposition of the gate dielectric material may be performed by PVD, CVD, ALD, thermal oxidation, thermal nitridation, or other suitable deposition methods. The deposition of the gate electrode material may be performed by CVD, PVD, ALD, or other suitable deposition methods. A patterning operation is performed on the blanket conductive material and the gate dielectric material to form separate gate electrodes 112 and their underlying gate dielectric layers. Portions of the doped regions 106 between the gate electrodes 112 are exposed through the gate electrodes 112.

According to some embodiments, gate spacers 114 (or sidewall spacers) are formed on sidewalls of the gate electrodes 112. According to some embodiments, the gate spacers 114 are formed of dielectric layers, such as silicon oxide, silicon nitride, silicon carbide, silicon oxynitride, high-k dielectric materials, or other suitable dielectric materials. In some embodiments, the gate spacers 114 include a single layer or multilayer structure. The gate spacers 114 may be formed by depositing one or more layers of dielectric materials over the gate electrodes 112 and the surface of the doped region 106 in a conformal manner, followed by etching the horizontal portion of the dielectric material. The vertical portion of the dielectric material is left on the sidewalls of the gate electrodes 112 to thereby form the gate spacers 114.

Referring to FIG. 1G, lightly-doped regions 116 are formed in the doped region 106 around the surface of the doped region 116. The lightly-doped regions 116 may be formed on two sides of each of the gate electrodes 112. The lightly-doped regions 116 may include a dopant of a conductivity type, e.g., P-type, opposite to that of the doped region 106. According to some embodiments, a portion of each of the lightly-doped regions 116 extend into a location below the gate spacers 114. The lightly-doped regions 116 may be doped regions formed by an ion implantation operation with an implant dose between about $10^{12}$ atoms/cm$^2$ and about $10^{17}$ atoms/cm$^2$.

Referring to FIG. 1H, source/drain regions 118 and 120 are formed as doped regions in the doped region 106 on two sides of the respective gate electrodes 112. The source/drain regions 118, 120 may include a plurality of source regions 118 and a plurality of drain regions 120, where the source regions 118 are arranged alternatively with the plurality of drain regions 120. The source/drain regions 118, 120 may include a dopant of a conductivity type, e.g., P-type, opposite to that of the doped region 106. In the present embodiment, the source regions 118 and the drain regions 120 serve as the multiple source terminals and the multiple drain terminals of the semiconductor device 100. Multiple channels of the semiconductor device 100 are formed in the doped region 106 between the pair of source/drain regions 118, 120 below the respective gate electrodes 112. The gate electrodes 112, the source regions 118 and the drain regions 120 form a plurality of MOSFETs. The doped region 106 is contiguous across the different MOSFETs, and thus the multiple channels may be connected to form an aggregate channel of the semiconductor device 100. The source/drain regions 118, 120 may be doped regions formed by an ion implantation operation with an implant dose between about $10^{18}$ atoms/cm$^2$ and about $10^{21}$ atoms/cm$^2$.

According to some embodiments, doped regions 122 are formed in the doped region 106 around the surface of the doped region 106. According to some embodiments, the doped regions 122 are near a periphery of the doped region 106. The doped regions 122 may be formed between two isolation regions 110 near the periphery of the doped region 106. The doped regions 122 may include a dopant of a conductivity type, e.g., P-type, opposite to that of the doped region 106. The doped regions 122 are referred to herein as a bulk region, which is configured to collect hot carriers (electrons) generated in the channels of the semiconductor device 100, i.e., the doped region 106, when the drain regions 120 are biased at a breakdown voltage. The hot electrons should be shunted from the semiconductor device 100 through the bulk region 122 as quickly as possible whenever they are generated in response to the breakdown voltage. The doped regions 122 may be doped regions formed by an ion implantation operation with an implant dose between about $10^{18}$ atoms/cm$^2$ and about $10^{21}$ atoms/cm$^2$.

According to some embodiments, doped regions 124 are formed in the doped region 108 around the surface of the doped region 108. According to some embodiments, the doped regions 124 are close to the doped region 106 and arranged on one side of the boundary of the doped region 106 opposite to the doped regions 122. The doped regions 124 may include a ring shape from a top-view perspective. The doped regions 124 may be formed between two isolation regions 110 near the periphery of the doped region 106. The doped regions 124 are configured as a substrate node electrically coupled to the bulk region 122 for shunting the hot electrons generated in the doped region 106. The doped regions 122 may include a dopant of a conductivity type, e.g., N-type, the same as that of the barrier layer 104. The doped regions 124 may be doped regions formed by an ion implantation operation with an implant dose between about $10^{18}$ atoms/cm$^2$ and about $10^{20}$ atoms/cm$^2$.

FIG. 1I shows a formation of an isolation region 119, in accordance with some embodiments of the present disclosure. The isolation region 119 may be formed at the same time as the formation of the isolation region 110. The isolation region 119 may be arranged between one or more of the gate electrodes 112 and the drain regions 120 adjacent to the one or more gate electrodes 112. The isolation region 119 may be used in a high-voltage application to increase the breakdown voltage of the drain region 120. According to some embodiments, the isolation region 119 may be omitted from the formation of the semiconductor device 100.

Referring to FIG. 1J, an interlayer dielectric (ILD) layer 130 is formed over the substrate 102, the doped regions 106, 108 and the gate electrodes 112 after the formation of the source/drain regions 118, 120, the bulk region 122 and the substrate nodes 124. The ILD layer 130 may include a dielectric material, such as silicon nitride, silicon oxide, or other suitable material. In some embodiments, the ILD layer 130 may be deposited to cover the epitaxial layer 105, the isolation regions 110, the source/drain regions 118, 120, the gate electrodes 112, and the gate spacers 114, followed by a planarization operation, such as chemical mechanical planarization (CMP), grinding, or other suitable planarization methods. The upper surface of the ILD layer 130 may be higher than the upper surfaces of the gate electrodes 112.

According to some embodiments, several conductive vias 132, 134, 136, 137 and 138 are formed in the ILD layer 130 and electrically coupled to the gate electrodes 112, the source regions 118, the drain regions 120, the doped regions 122 and the doped regions 124, respectively. The conductive vias 132, 134, 136, 137, 138 may be formed by etching openings through the ILD layer 130 by a patterning operation. A conductive material may fill the openings to electrically connect the underlying structures (e.g., the gate electrodes 112, the source regions 118, the drain regions 120, the bulk regions 122, and the substrate nodes 124) to overlying structures. The conductive material of the conductive vias 132, 134, 136, 137, 138 may include, but is not limited to, titanium, tantalum, titanium nitride, tantalum nitride, copper, copper alloys, nickel, tin, gold, or combinations thereof.

FIGS. 1K to 1O show the formation of an interconnect structure 140 over the MOSFETs. The interconnect structure 140 may be formed to provide one or more interconnected conduction paths which electrically couple the features below the interconnect structure 140 to each other. According to some embodiments, the interconnect structure 140 is provided to electrically couple its underlying features to the components or circuits overlying the interconnect structure 140 or adjacent to the semiconductor device 100. According to some embodiments, the interconnect structure 140 includes conductive pads on the uppermost layer for providing input/output terminals.

Referring to FIG. 1K, a first dielectric layer **140*a* is formed over the ILD layer 130. The first dielectric layer 140*a* may include one or more dielectric layers deposited over one another. The first dielectric layer 140*a* may include at least one of silicon oxide, silicon nitride, silicon carbide, silicon oxynitride, or other high-k dielectric materials. According to some embodiments, the first dielectric layer 140*a* is patterned to form openings extending therethrough. The patterning operation may include photolithography and etching operations. A conductive material is deposited in the openings and over the surface of the first dielectric layer 140*a*. The conductive material may include tungsten, copper, aluminum, silver, gold, titanium, tantalum, alloys thereof, or the like. The deposition of the first dielectric layer 140*a* or the conductive material may be performed by CVD, PVD, ALD, or other suitable deposition methods. A planarization operation, e.g., CMP or mechanical grinding, is utilized to remove the excess material of the conductive material and level the upper surface of the first dielectric layer 140*a* with the upper surface of the conductive material. One or more metal lines 142 are thus formed in the first dielectric layer 140*a* and electrically coupled to the underlying features, e.g., the conductive vias 132, 134, 136, 137 and 138**.

Referring to FIG. 1L, a second dielectric layer **140*b* is formed over the first dielectric layer 140*a*. The second dielectric layer 140*b* may include one or more dielectric layers deposited over one another. The second dielectric layer 140*b* may include at least one of silicon oxide, silicon nitride, silicon carbide, silicon oxynitride, or other high-k dielectric materials. According to some embodiments, the second dielectric layer 140*b* is patterned to form openings extending therethrough and expose the underlying metal lines 142. The patterning operation may include photolithography and etching operations. A conductive material is deposited in the openings. The conductive material may include tungsten, copper, aluminum, silver, gold, titanium, tantalum, alloys thereof, or the like. The deposition of the second dielectric layer 140*b* or the conductive material may be performed by CVD, PVD, ALD, or other suitable deposition methods. A planarization operation, e.g., CMP or mechanical grinding, is utilized to remove the excess material of the conductive material and level the upper surface of the second dielectric layer 140***b* with the upper surface of the conductive material. One or more metal vias 143 are thus formed in the second dielectric layer 104*b* and electrically coupled to the underlying features, e.g., the metal lines 142.

FIG. 1M illustrates the formation of the third dielectric layer 140*c* over the second dielectric layer 140*b*, and metal lines 144, 152 in the third dielectric layer 140*c*. The materials, configurations, and method of forming for the third dielectric layers 140*c* and the metal lines 144, 152 are similar to those of the first dielectric layer 140*a* and the metal lines 142.

FIG. 1N illustrates the formation of the fourth dielectric layer 140*d* and the fifth dielectric layer 140*e* over one another, and the metal vias 145 and metal lines 146 in the fourth dielectric layer 140*d* and the fifth dielectric layer 140*e*, respectively. The same procedure illustrated in FIGS. 1K to 1N may be repeated on demand until a topmost dielectric layer 140*x*. FIG. 1O illustrates the formation of the topmost dielectric layer 140*x* and metal lines 148 in the topmost dielectric layer 140*x*. The materials, configurations, and method of forming for the fourth dielectric layers 140*d*, the fifth dielectric layer 140*e*, the topmost dielectric layer 140*x*, and the metal vias 145, the metal lines 146 and 148 are similar to those of the first dielectric layer 140*a*, the second dielectric layer 140*b*, the metal lines 142 and the metal vias 143.

Figure 2B:
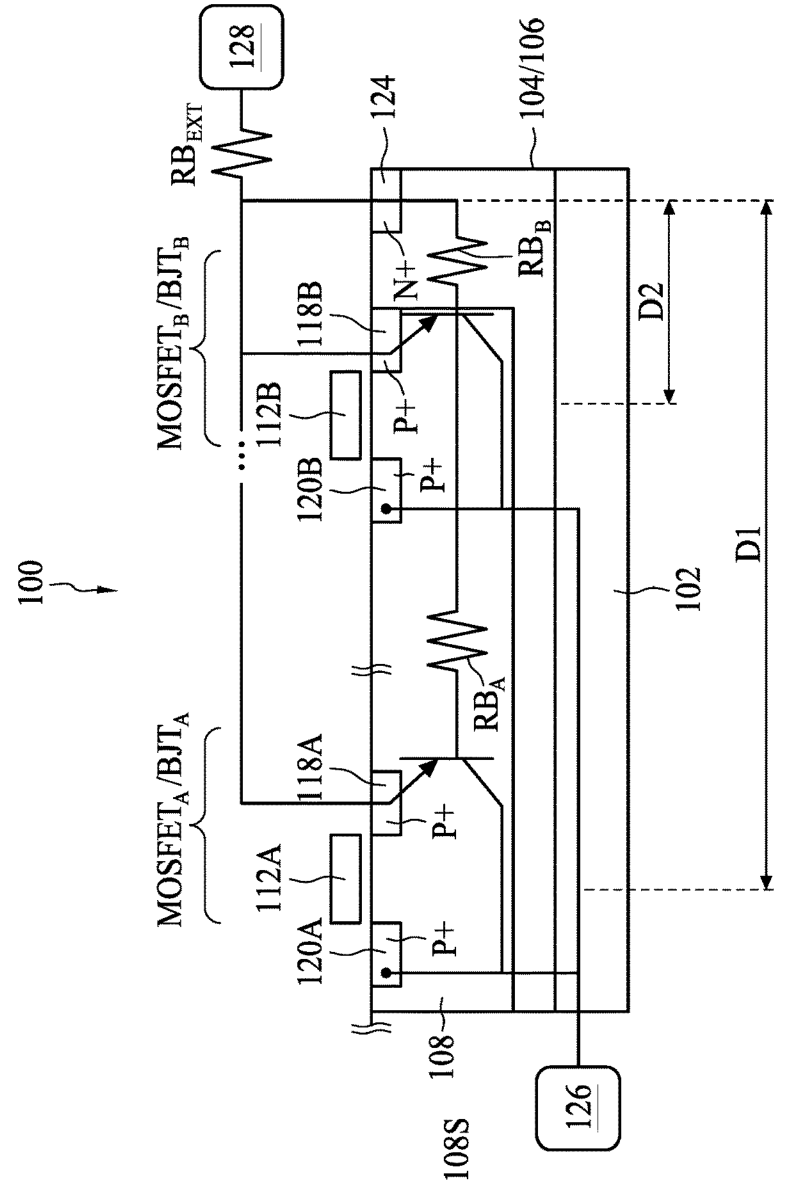
FIG. 2B shows an equivalent circuit of the semiconductor device shown in FIG. 2A, in accordance with some embodiments of the present disclosure.
Figure 2A:
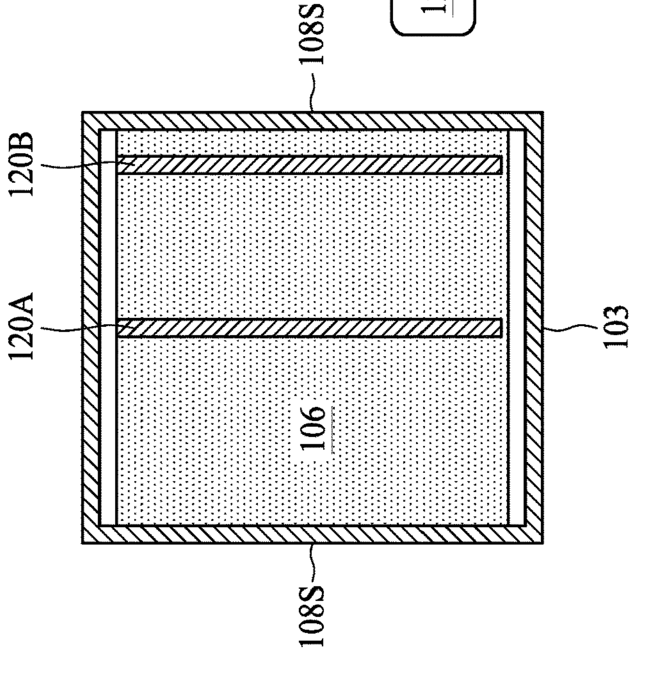
FIG. 2A shows a top view of the semiconductor device shown in FIG. 1O, in accordance with some embodiments of the present disclosure.

FIG. 2A shows a top view of the semiconductor device 100, in accordance with some embodiments of the present disclosure. FIG. 2A only shows the doped region 106, the doped regions 108, and two representative drain regions 120A, 120B of the respective MOSFETs, i.e., $MOSFET_A$ and $MOSFET_B$, respectively, of the semiconductor device 100. Other components of the semiconductor device 100 are omitted from FIG. 2A for clarity. Referring to FIG. 2A, the doped regions 108 of the well region 103 form a ring shape laterally surrounding the doped region 106. According to some embodiments, the lateral sides 108S of the doped regions 108 on two sides of the doped region 106 are operable to shunt avalanche current generated in the doped region 106 when the drain regions 120 are biased at a breakdown voltage.

Referring to FIG. 1O and FIG. 2A, the semiconductor device 100 is constructed by a plurality of MOSFETs connected together, in which each MOSFET is formed of a gate electrode 112, a source region 118 and a drain region 120 serving as the gate terminal, the source terminal and the drain terminal, respectively, of the MOSFET. The source region 118 and the drain region 120 of any one of the MOSFETs are arranged on two sides of the respective gate electrode 112 of the MOSFET. According to some embodiments, the MOSFETs are arranged in a row in a horizontal direction between the lateral sides 108S of the doped region 108.

According to some embodiments, the gate electrodes 112 are electrically coupled to a control signal, the source regions 118 are electrically coupled to a reference voltage, e.g., ground, and the drain regions 120 are coupled to a high voltage node. The high voltage node may be directly or indirectly coupled to an inductor device, or other high-voltage sources. When breakdown occurs due to a voltage spike, e.g., a high reversed voltage, applied to the drain terminals, the channels of the MOSFET generate a great amount of hot electrons. These hot electrons can be shunted as avalanche current through either the conduction path formed by the drain regions 120 and source regions 118, or through the conduction path formed through the bulk regions 122 and the substrate node 124. The avalanche current may cause permanent damage to the MOSFETs easily when it pass through the source regions 118 and the drain regions 120. Alternatively or additionally, these hot electrons can also be shunted through the bulk regions 122 without damaging the semiconductor device 100.

The current shunting effects of the bulk regions 122 for each of the MOSFETs within the semiconductor device 100 depend upon several factors, and one of the dominant factors is the distance between the individual MOSFETs and the lateral side 108S of the doped region 108. The shorter the distance is between the drain regions 120 and the closest bulk region 122 (or the substrate node 124), the more easily the avalanche current can be shunted through the bulk region 122, and thus the less damage the avalanche current causes to the semiconductor device 100.

According to some embodiments, the failures of the individual MOSFETs due to the avalanche current occur as a chain reaction, and as one of the connected MOSFETs (e.g., the central one $MOSFET_A$ most far away from the bulk regions 122) fails due to the avalanche current, the adjacent MOSFETs will also be damaged by the avalanche current subsequently until the last MOSFETs (e.g., the edge $MOSFET_B$ closest to the bulk regions 122) fails due to the avalanche current.

FIG. 2B shows an equivalent circuit of the semiconductor device 100 shown in FIG. 2A, in accordance with some embodiments of the present disclosure. According to some embodiments, each of the individual MOSFETs includes respective gate electrodes (e.g., 112A, 112B), respective source regions (e.g., 118A, 118B), respective drain regions (e.g., 120A, 120B), and respective parasitic PNP BJTs (e.g., $BJT_A$, $BJT_B$). For example, the P-type drain regions 120A and 120B are configured as a collector terminals of the respective $BJT_A$ and $BJT_B$, the P-type source regions 118A and 118B are coupled to the substrate 102 and are configured as the emitter terminals of the respective $BJT_A$ and $BJT_B$. The N-type doped region 106 are electrically coupled to the bulk regions 122 and configured as the base terminals of the respective $BJT_A$ and $BJT_B$. According to some embodiments, the base terminal of each of the BJTs includes a parasitic base resistance RB, e.g., $RB_A$ and $RB_B$. According to some embodiments, the parasitic base resistance $RB_A$ of the $BJT_A$ has a greatest resistance among all of the parasitic BJTs due to its maximal distance D1 between the location of the $BJT_A$ and the bulk region 122 arranged on the edge of the doped region 106. According to some embodiments, when $BJT_A$ is the central BJT of the plurality of BJTs, the distance D1 between the $BJT_A$ and the bulk region 122 is substantially one half of the width W1 (see FIG. 1O) of the doped region 106 from a cross-sectional view. According to some embodiments, the parasitic base resistance $RB_B$ of the $BJT_B$ has a smallest resistance among all of the parasitic BJTs due to its minimal distance D2 between the $BJT_B$ and the bulk region 122. According to some embodiments, referring to FIG. 1O, the distance D2 between the $BJT_B$ and the bulk region 122 is substantially equal to the width of an isolation region 110 from a cross-sectional view.

According to some embodiments, when the distance D1 or D2 is not made large enough, the resultant parasitic base resistance $RB_A$ or $RB_B$ is relatively small. When the drain regions 120 are biased at a high reversed voltage, i.e., a breakdown voltage, the hot electrons generate an avalanche current from the channels of the MOSFETs to the bulk region 122. The voltage at the base terminals of any of BJTs is obtained by the product of the avalanche current and the parasitic base resistance. Since the parasitic base resistances RBs are not made great enough, the parasitic PNP BJTs would not be turned on by the avalanche current, and the avalanche current will not be shunted quickly through the bulk region 122. Therefore, when the breakdown voltage is increased in level or is repeatedly applied with pulses, the increased avalanche current may flow through the drain regions 120 and damage the MOSFETs, i.e., the semiconductor device 100 may fail.

Figure 3:
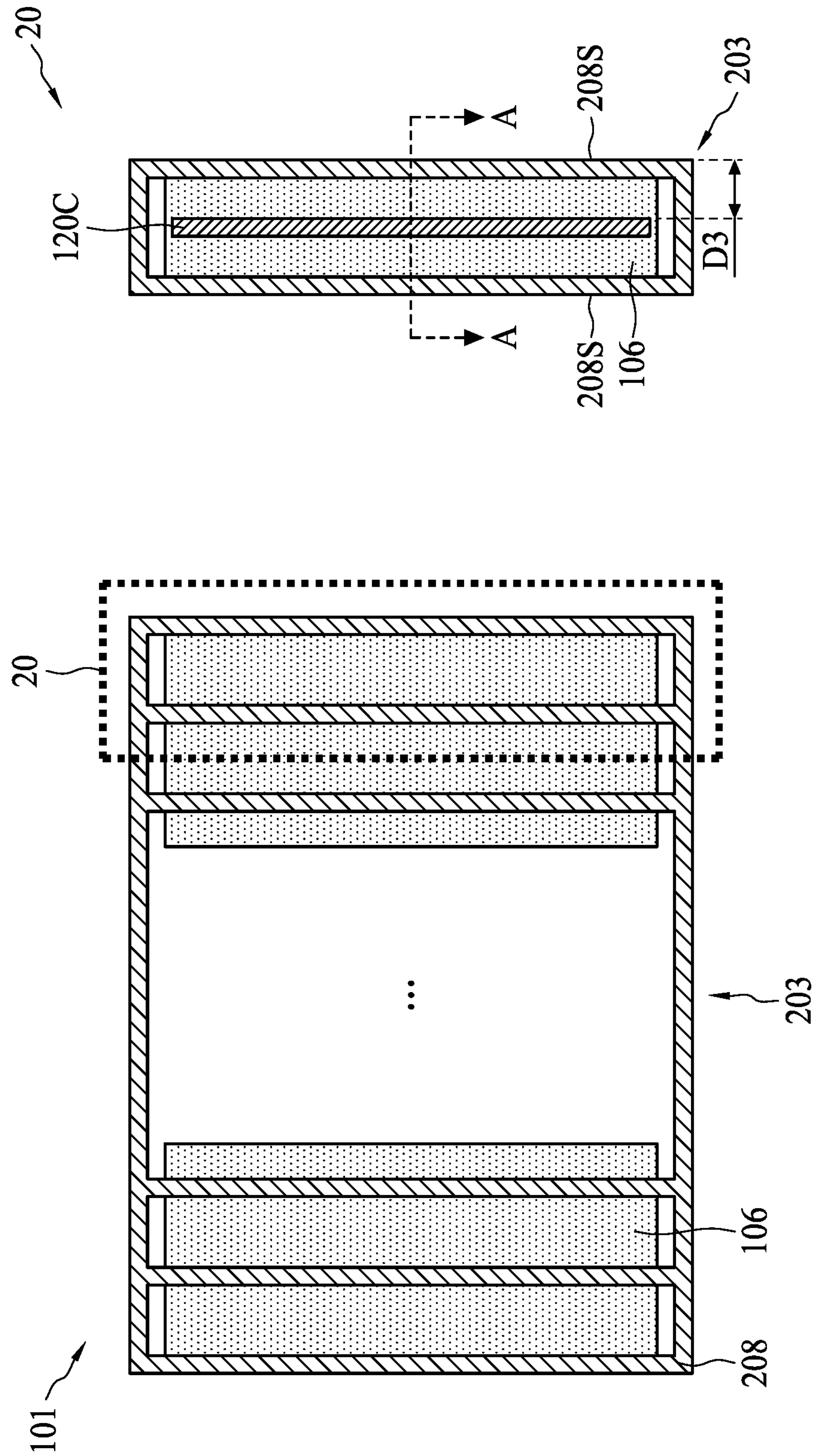
FIG. 3 shows a top view of a semiconductor device, in accordance with some comparative embodiments of the present disclosure.

FIG. 3 shows a top view of a semiconductor device 101, in accordance with some comparative embodiments of the present disclosure. Referring to FIG. 2A and FIG. 3, the semiconductor device 101 is similar to the semiconductor device 100 in many aspects, and these similar features will not be repeated for brevity. FIG. 3 also shows an enlarged view of a portion 20 of the semiconductor device 101. The semiconductor device 101 includes a well region 203 formed of grid-shaped doped regions 208, and the doped region 106 laterally surrounded by the doped regions 208. The semiconductor device 101 is different from the semiconductor device 100 mainly in the arrangement of the well region 203, especially the doped regions 208. The doped regions 108 of the semiconductor device 101 are arranged in a grid shape, and the maximal distance D3 between the drain region 120C of any MOSFET of the semiconductor device 101 and the lateral side 208S is reduced as compared to the distance D1. In other words, the portion 20 of the semiconductor device 101 is similar to the ring-shaped doped regions 108 of the semiconductor device 100, except that the number of consecutive MOSFETs of the semiconductor device 100 formed in the doped region 106 without partition by the well region 203 is greater than the number of those formed in the portion 20 of the semiconductor device 101.

As discussed previously, the grid portions of the doped regions 208 interposed between the adjacent MOSFETs in the doped region 106 may help shunt the abruptly generated hot carriers quickly from the bulk regions 122, and the damage caused by the avalanche current may be minimized. However, it is necessary to increase the area of the grid-shaped doped regions 208 between the MOSFETs to maintain a safe SOA, and thus the cost may be increased.

Referring to FIG. 2B, according to some embodiments, the distance D1 is made sufficiently great such that the voltage drop between the base terminal of the $BJT_A$, arranged at the center of the doped region 106, and the bulk region 122, arranged at the edge of the doped region 106, is made sufficiently large. That will cause a non-trivial voltage drop $V_B$ between the base terminal and the collector terminal under the breakdown voltage when avalanche current is generated. The large avalanche current will pull up the base terminal voltage $V_B$ due to the large base resistance and large avalanche current, and the $BJT_A$ is turned on accordingly to conduct the collector current to the bulk region 122. According to some embodiments, the PNP $BJT_A$ is configured as the active region or the breakdown region under the breakdown voltage, in which the source region 118 (serving as the emitter) has a voltage much greater than the drain region 120A (serving as the collector) while the dope region 106 (base) and the drain region 120 has a voltage drop $V_B$ determined by the parasitic resistance $RB_A$.

Figure 4:
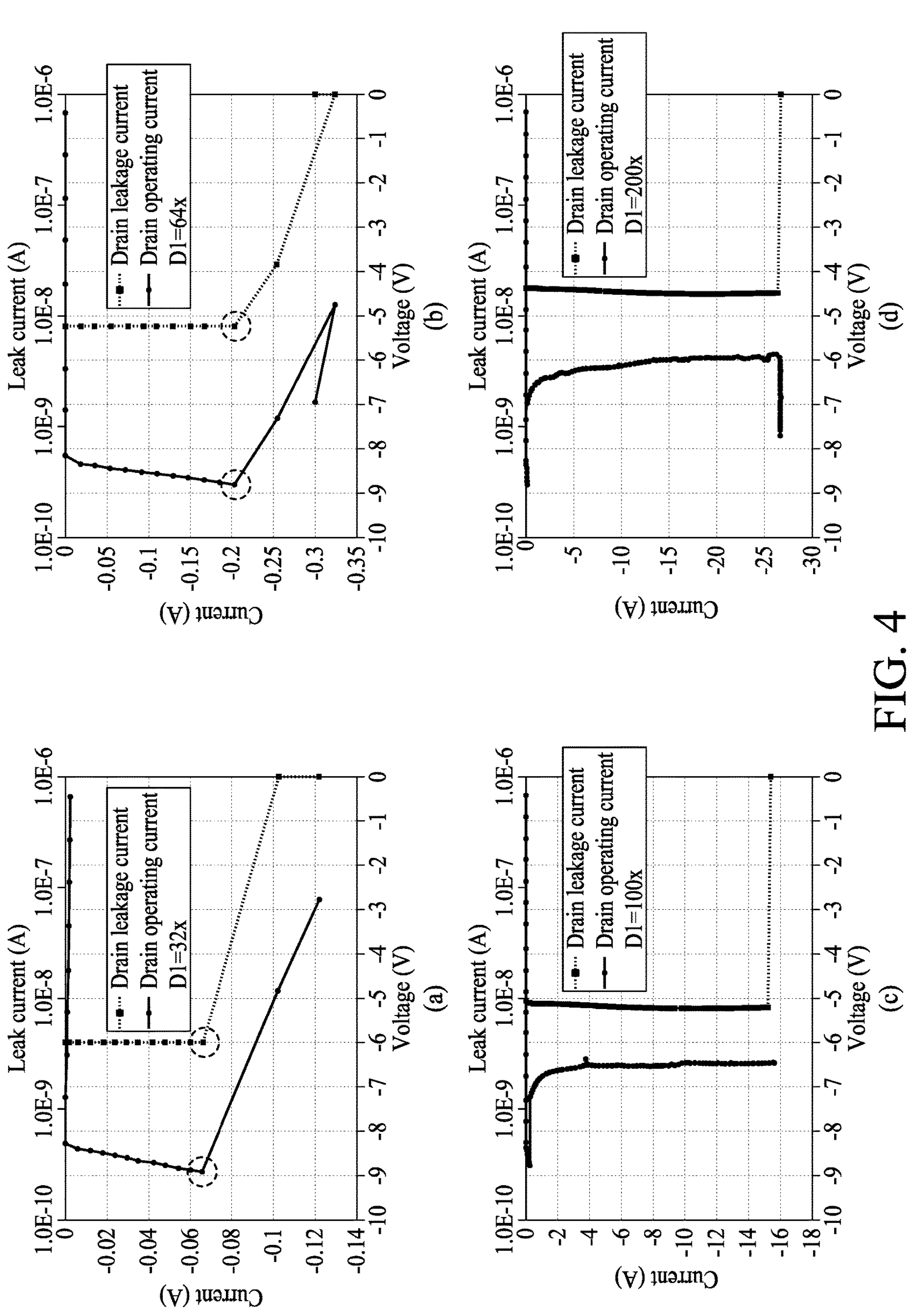
FIG. 4, including subfigures (a), (b), (c) and (d), shows simulation results of an avalanche current of a semiconductor device for different device parameters, in accordance with various embodiments of the present disclosure.

FIG. 4 shows a simulation result of the avalanche current of a semiconductor device for different device parameters, in accordance with various embodiments of the present disclosure. FIG. 4 illustrates the simulation results under four different widths D1 between $BJT_A$ as the central MOSFET and the bulk region 122. The lower horizontal axis represents the reversed voltage biased at the drain region 120A, the upper horizontal axis represents the leakage current level after the reversed voltage is applied, and the vertical axis represents the operating drain current level under the biased voltage. The widths D1 are set as the multiples of the pitch of the gate electrodes 112, for example, the 32 times, 64 times, 100 times and 200 times of the pitch of the gate electrodes 112.

According to the first subfigure (a), the width D1 is set as only 32 times of the pitch of the gate electrodes 112, and thus the resultant based resistance $RB_A$ of the parasitic PNP $BJT_A$ may be relatively small. The operating current is increased under a breakdown event when the reversed voltage is greater than about −8.3 volts, and the $MOSFET_A$ is about to be damaged at around −9 volts, where the avalanche current occurs and the leakage current is enlarged significantly. The reason why the semiconductor device 100 in the configuration of subfigure (a) fails may be due to that non of the parasitic BJTs (including the $BJT_A$) can be turned on before the $MOSFET_A$ are damaged by the avalanche current through the drain region 120A. The turning points of the operation current and the leakage current annotated by dashed circles in subfigure (a) signify that the leakage current is still increased significantly after stopping application of the reversed voltage, which imply the permanent failure of the $MOSFET_A$.

The abovementioned effect can also be observed similarly in the subfigure (b), where the distance D1 is set as 64 times of the pitch of the gate electrodes 112. The operating drain current is increased significantly when the reversed voltage is greater than about −8.3 volts, and the $MOSFET_A$ is about to be damaged at around −9 volts, where the avalanche current occurs and the leakage current is enlarged significantly.

Referring to subfigures (c) and (d), wherein the distance D1 is set as 100 times or 200 times of the pitch of the gate electrodes 112. The resultant resistance $RB_A$ of at least the parasitic PNP $BJT_A$ among the all MOSFETs can be pulled up in voltage and thereby turned on the respective $BJT_A$. The avalanche current is shunted through the bulk region 122 at a scale of at least 50 times greater than that of the configuration in subfigure (b). After stopping application of the breakdown voltage, the leakage current is kept as the normal range after the large current is shunted, which signifies that the semiconductor device 100 works well after the application of the breakdown voltage around −9 volts. The range of the SOA of the semiconductor device 100 is thus enhanced.

Figure 5:
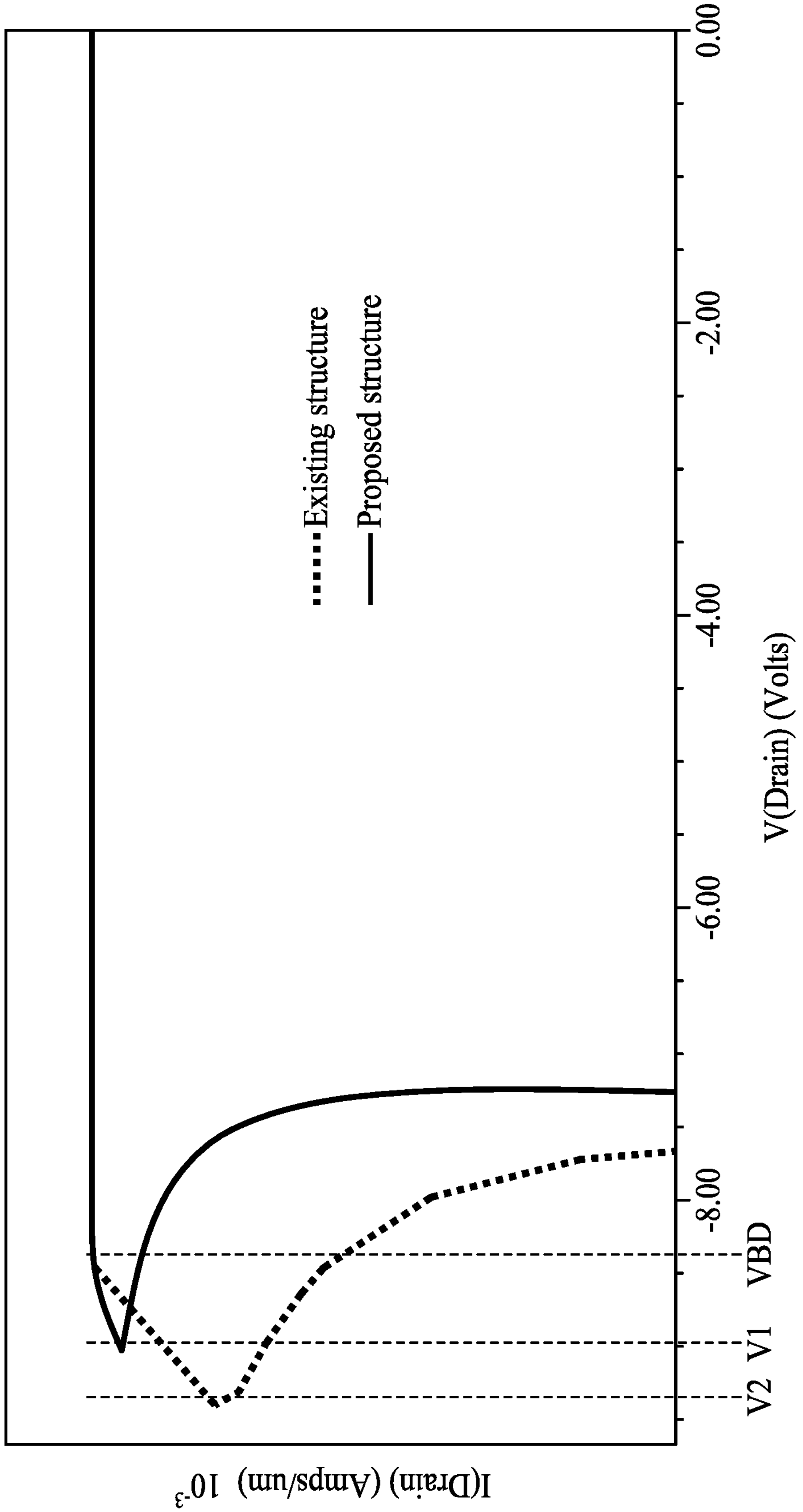
FIG. 5 shows a simulation result of a variation of an avalanche current in a semiconductor device under different biased voltages, in accordance with various embodiments of the present disclosure.

FIG. 5 shows a comparison of simulation results of an avalanche current in a semiconductor device under different biased voltages, in accordance with various embodiments of the present disclosure. FIG. 5 shows a comparison of avalanche currents between an existing structure, e.g., the semiconductor device 101 which has a relatively small distance D3, and the proposed structure, e.g., the semiconductor device 100 which has a sufficiently great distance D1. According to some embodiments, the distance D1 provided in the proposed structure allows the parasitic base resistance RB to be great enough to pull up the voltage of the base terminal of the parasitic BJT and thereby turn on the parasitic BJT. The horizontal axis represents the reversed voltage level, while the vertical axis represents the drain current level.

Referring to FIG. 5, when the reversed voltage is increased to the breakdown voltage VBD, the reversed drain current starts to increase. As the reversed voltage continues to increase to a first critical voltage V1, at least one of the parasitic BJT in the propose structure is turned on, and a large amount of avalanche current starts to be shunted. The biased reverse voltage is decreased along with the discharging of the hot electrons in the propose structure. According to some embodiments, at least one MOSFET (and the accompanying parasitic BJT) arranged close to the center of the doped region 106 of the semiconductor device 100 is operable to be turned on at the breakdown voltage VBD. According to some embodiments, the parasitic BJTs are turned on subsequently from center to the edge of the doped region 106.

In contrast, in the existing structure, none of the parasitic BJTs in the MOSFETs is operable to be turned before the MOSFETs are damaged by the avalanche current due to the insufficient base resistance RB of all of the parasitic BJTs. As a result, when the reversed voltage in increased to the second critical voltage V2, before which none of the parasitic BJTs is turned on to shunt the hot electrons of the avalanche current, the MOSFETs are all damaged eventually by the increased avalanche current. The second critical voltage V2 is greater than the first critical voltage V1 in the absolute value. According to some embodiments, the MOSFETs are damaged consequently from center to the edge of the doped region 106 in the existing structure when the revered voltage is biased at the second critical voltage V2.

As discussed previously, the key factors to turning on of the parasitic PNP BJTs of the semiconductor device 100 include ensuring that the base resistance RB of the parasitic BJT is sufficiently large such that the parasitic BJT is operable to turn on for shunting the avalanche current at a first voltage V1 less than a breakdown voltage V2 which causes permanent damage to the semiconductor device 100. The base resistance RB can be formed in a parasitic manner or an external manner. The parasitic base resistance RB is provided by forming the N-type doped region 106 with a sufficient width W1 (see FIG. 1O) such that the distance W2 or D1 between the bulk region 122 and at least one of the MOSFETs (e.g., the central MOSFET) is sufficiently large to provide a parasitic resistance as the base resistance RB. According to some embodiments, the effective parasitic base resistance RB is determined by one or more of the factors including: the width W1 or the distance W2, the doping concentration of the doped region 106, other parasitic resistance between the doped region 106 and the well region 103, and the like.

Another approach to increase the base resistance RB is to arrange an external resistor element between the base terminal and ground. Referring to FIG. 2B, the source regions 118 of all the MOSFETs, e.g., the source regions 118A, 118B, are coupled together and coupled to the bulk region 122. The source regions 118 and the bulk region 122 are further grounded, e.g., through being electrically coupled to a ground pad, e.g., a conductive pad 128. At the same time, the drain regions 120 of all the MOSFETs, e.g., the drain regions 120A, 120B, are coupled together to receive a high voltage source through a conductive pad 126. An external resistor $RB_{EXT}$ is arranged between the ground pad 128 and the bulk region 122 to increase the effective base resistance RB measured between the hypothesized base terminal of the BJT and ground. According to some embodiments, the value of the external resistance $RB_{EXT}$ can be appropriately determined based on the same principle of the parasitic base resistance.

According to some embodiments, the external resistor $RB_{EXT}$ are arranged in various forms in various locations or layers of the semiconductor device 100. Referring to FIGS. 1M to 1O, a metal line 152 is deposited in the third dielectric layer 140*c* and electrically coupled to the bulk region 122 through the conduction path in the first dielectric layer 140*a* and the second dielectric layer 140*b*. Although not separately shown, the metal line 152 can be further coupled to a ground terminal of the semiconductor device 100 such that the metal line 152 can serve as the external resistor $RB_{EXT}$. The external resistor $RB_{EXT}$ is also referred to as a back-end-of-line (BEOL) resistor, or a backend resistor. The resistance of the metal line 152 can be determined by, e.g., its dimensions, materials, and locations.

Figure 6A:
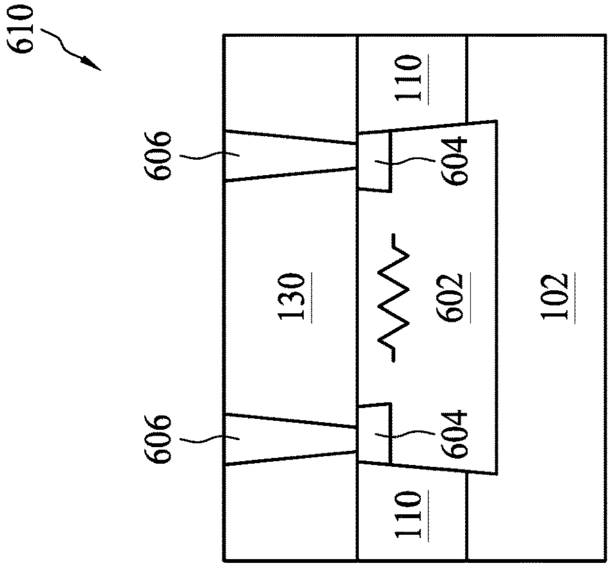
FIGS. 6A, 6B and 6C show schematic cross-sectional views of front-end resistors, in accordance with various embodiments of the present disclosure.
Figure 6B:
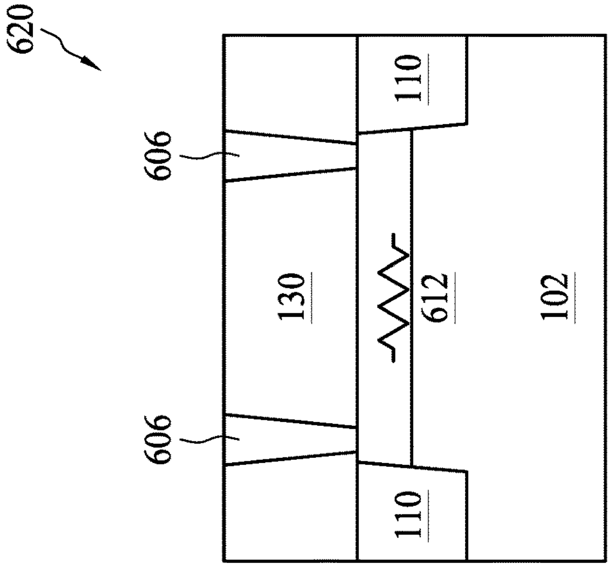
Figure 6C:
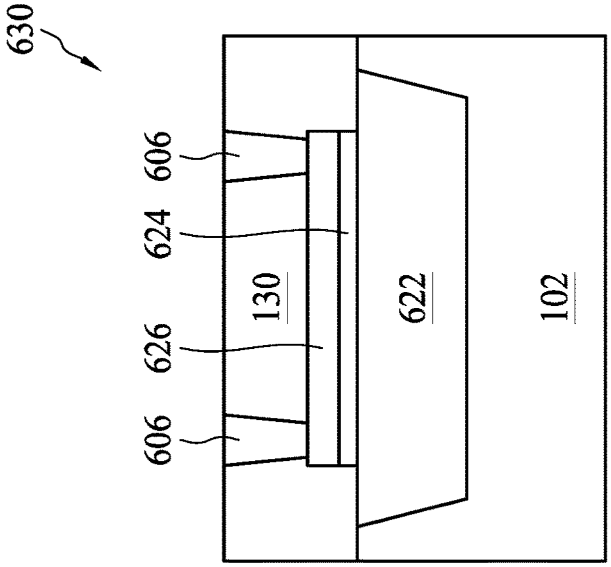

According to some embodiments, the external resistor $RB_{EXT}$ can be formed in the substrate 102, and is referred to as a front-end-of-line (FEOL) resistor, or a front-end resistor. FIGS. 6A, 6B and 6C show schematic cross-sectional views of front-end resistors 610, 620, 630, in accordance with various embodiments of the present disclosure. Referring to FIGS. 6A to 6C, the substrate 102, the isolation regions 110 and the ILD layer 130 are shown. The materials, configurations and methods of forming for the substrate 102, the isolation regions 110 and the ILD layer 130 are described with reference to FIGS. 1A to 1O, and will not be repeated herein.

Referring to FIG. 6A, a well region 602 is formed in the substrate 102 between the adjacent isolation regions 110. The well region 602 is formed close to the surface of the substrate 102. The well region 602 may be formed by ion implantation, and may include a P-type or N-type dopant. According to some embodiments, the well region 602 has a depth greater than that of the isolation regions 110. Doped regions 604 are formed in the substrate 102 on two ends of the well region 602. The doped regions 604 may include the dopant type same as that of the well region 602 and have a doping concentration greater than that of the doped region 602. Conductive vias 606 are formed in the ILD layer 130 to be electrically coupled to the doped regions 604. The materials and method of forming of the conductive vias 606 are similar to those of the conductive vias 132, 134, 136, 137, 138 with reference to FIGS. 1J to 1O. According to some embodiments, the doped regions 604 serve as resistor contacts to reduce the contact resistance between the well region 602 and the conductive vias 606. The front-end resistor 610 may be a well-type resistor and be electrically coupled to the bulk region 122 of the semiconductor device 100 through the interconnect structure 140. The resistance of the well-type resistor 610 may be determined by the dimensions (length, width, depth) of the well region 602, the concentration of the well region 602 and the doped regions 604, and the like.

Referring to FIG. 6B, a doped region 612 is formed in the substrate 102 between the adjacent isolation regions 110. The doped region 612 is formed close to the surface of the substrate 102. The doped region 612 may be formed by ion implantation, and may include a P-type or N-type dopant. According to some embodiments, the doped region 612 has a depth less than that of the isolation regions 110. The doped region 612 may have a doping concentration substantially equal to the doping concentration of the doped regions 604. The conductive vias 606 are formed in the ILD layer 130 to be electrically coupled to the two ends of the doped regions 612. The front-end resistor 620 may be a diffused-type resistor electrically coupled to the bulk region 122 of the semiconductor device 100 through the interconnect structure 140. The resistance of the diffused-type resistor 620 may be determined by the dimensions (length, width, depth) of the doped region 612, the concentration of the doped region 612, and the like.

Referring to FIG. 6C, an isolation region 622 is formed in the substrate 102. The material and method of forming of the isolation region 622 may be similar to those of the isolation regions 110, but the width of the isolation region 622 may be greater than that of the isolation region 110. A dielectric layer 624 is formed over the substrate 102 and the isolation regions 622. The dielectric layer 624 may be formed of a high-k dielectric material or other suitable material. According to some embodiments, the dielectric layer 624 is formed by CVD, PVD, ALD or other suitable methods. A conductive layer 626 is formed over the dielectric layer 624. The conductive layer 626 may include a conductive material, e.g., doped polysilicon, titanium nitride, or other metallic material. The conductive vias 606 are formed in the ILD layer 130 to be electrically coupled to the two ends of the conductive layer 626. The front-end resistor 630 may be a poly-type resistor electrically coupled to the bulk region 122 of the semiconductor device 100 through the interconnect structure 140. The resistance of the poly-type resistor 630 may be determined by the dimensions (length, width, depth) of the conductive layer 626, the doping concentration or material of the conductive layer 626, and the like.

Figure 7:
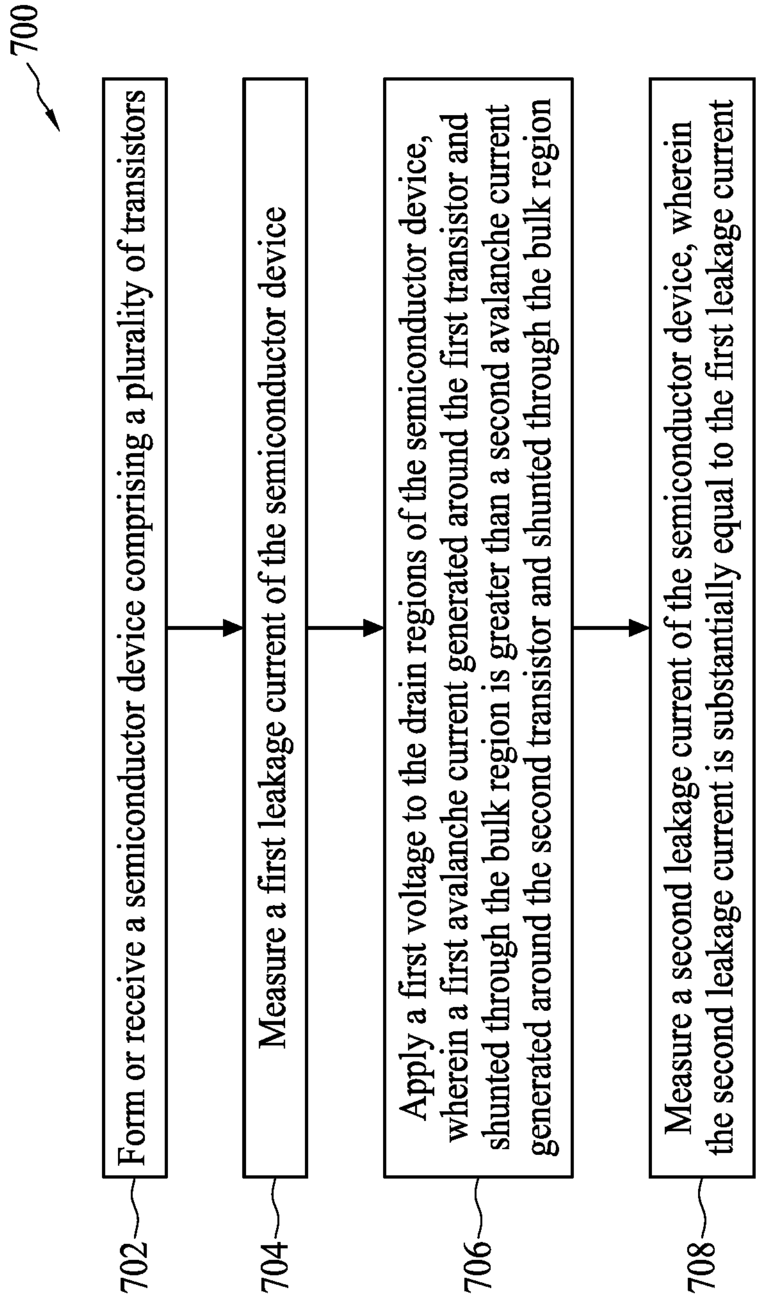
FIG. 7 is a flowchart of a method of operating a semiconductor device, in accordance with some embodiments of the present disclosure.

FIG. 7 is a flowchart of a method 700 of operating a semiconductor device, in accordance with some embodiments of the present disclosure. It shall be understood that additional steps can be provided before, during, and after the steps in method 700, and some of the steps described below can be replaced with other embodiments or eliminated. The order of the steps shown in FIG. 7 may be interchangeable. Some of the steps may be performed concurrently or independently.

At step 702, a semiconductor device (e.g. semiconductor device 100) including a plurality of transistors is formed or received. According to some embodiments, the semiconductor includes a well region (e.g., the well region 103 formed of the barrier layer 104 and the doped regions 108) in a substrate (e.g., substrate 102), a doped region (e.g., the doped region 106) in the substrate over the well region, a plurality of gate electrodes (e.g., gate electrodes 112) disposed over the doped region and electrically coupled to each other, a plurality of source regions (e.g., the source regions 118) in the substrate and electrically coupled together, a plurality of drain regions (e.g., the drain regions 120) in the substrate and electrically coupled together. The semiconductor device may further include one or more bulk region disposed in the doped region at a periphery of the doped region and electrically coupled to the well region. According to some embodiments, the plurality of gate electrodes, the plurality of source region and the plurality of drain regions form a plurality of transistors (e.g., $MOSFET_A$ and $MOSFET_B$). According to some embodiments, a first distance (e.g., the distance D1) measured between a first transistor (e.g., $MOSFET_A$) of the plurality of transistors and the bulk region is greater than a second distance (e.g., the distance D2) measured between a second transistor (e.g., $MOSFET_B$) of the plurality of transistors and the bulk region.

At step 704, a first leakage current of the semiconductor device is measured. The first leakage current represents the normal operation condition of the semiconductor device free of any breakdown damage.

At step 706, a first voltage is applied to the drain regions of the semiconductor device. The first voltage may be a high reversed voltage or breakdown voltage for the semiconductor device. According to some embodiments, in response to the first voltage, a first avalanche current generated around the first transistor and shunted through the bulk region is greater than a second avalanche current generated around the second transistor and shunted through the bulk region.

According to some embodiments, a first parasitic BJT is formed of the substrate, the doped region, the bulk region and the first transistor, wherein the first BJT is turned on to shunt the first avalanche current in response to the first voltage.

According to some embodiments, a second parasitic BJT is formed of the substrate, the doped region, the bulk region and the second transistor, wherein a first base resistance measured between the first BJT and ground is greater than a second base resistance measured between the second BJT and ground.

According to some embodiments, the second parasitic BJT is turned off in response to the first voltage due to that the second base resistance is not great enough to pull up the base terminal voltage for turning on the second parasitic BJT.

According to some embodiments, the first avalanche current generated around the first transistor occurs earlier than the second avalanche current. According to some embodiments, the second avalanche current is generated in response to the turning on of the second BJT, in which the turning on of the second BJT is in response to the turning on of the first BJT, which causes the first avalanche current and reduces the required turn-on voltage of the second BJT.

At step 708, a second leakage current of the semiconductor device is measured after stopping application of the first voltage. In the proposed structure, the second leakage current is substantially equal to the first leakage current, which signifies that the semiconductor device restores to the normal operating condition, just like before the first voltage is applied. In other words, the proposed structure can protect the semiconductor device from the damage of avalanche current during the breakdown event.

In accordance with some embodiments of the present disclosure, a method is provided. The method includes: receiving the semiconductor device, wherein the semiconductor device includes: a well region in a substrate; a doped region in the substrate over the well region; a plurality of gate electrodes disposed over the doped region and electrically coupled to each other; a plurality of source regions in the substrate and electrically coupled together; a plurality of drain regions in the substrate and electrically coupled together, wherein the plurality of gate electrodes, the plurality of source region and the plurality of drain regions form a plurality of transistors, respectively; and a bulk region disposed in the doped region at a periphery of the doped region and electrically coupled to the well region. A first distance measured between a first transistor of the plurality of transistors and the bulk region is greater than a second distance measured between a second transistor of the plurality of transistors and the bulk region. The method further includes: applying a first voltage to the plurality of drain regions, wherein a first avalanche current generated around the first transistor and shunted through the bulk region is greater than a second avalanche current generated around the second transistor and shunted through the bulk region.

In accordance with some embodiments of the present disclosure, a method is provided. The method includes: receiving the semiconductor device, wherein the semiconductor device includes: a well region in a substrate; a doped region in the substrate over the well region; a plurality of gate electrodes disposed over the doped region and electrically coupled to each other; a plurality of source regions in the substrate and electrically coupled together; a plurality of drain regions in the substrate and electrically coupled together, wherein the plurality of gate electrodes, the plurality of source region and the plurality of drain regions form a plurality of transistors, respectively; and a bulk region disposed in the doped region at a periphery of the doped region and electrically coupled to the well region. A first distance measured between a first transistor of the plurality of transistors and the bulk region is greater than a second distance measured between a second transistor of the plurality of transistors and the bulk region. The method further includes: measuring a first leakage current of the semiconductor device; applying a first voltage to the plurality of drain regions to cause an avalanche current to occur at least around the first transistor; and stopping application of the first voltage to the plurality of drain regions and measuring a second leakage current of the semiconductor device, wherein the second leakage current is substantially equal to the first leakage current.

In accordance with some embodiments of the present disclosure, a semiconductor device includes: a well region in a substrate; a doped region in the substrate over the well region; a plurality of gate electrodes disposed over the doped region and electrically coupled to each other; a plurality of source regions in the substrate and electrically coupled together; a plurality of drain regions in the substrate and electrically coupled together, wherein the plurality of gate electrodes, the plurality of source region and the plurality of drain regions form a plurality of transistors, respectively; and a bulk region disposed in the doped region at a periphery of the doped region and electrically coupled to the well region. A first distance measured between a first transistor of the plurality of transistors and the bulk region is greater than a second distance measured between a second transistor of the plurality of transistors and the bulk region. The semiconductor device is configured to receive a first voltage at the plurality of drain regions to generate an avalanche current, wherein a first avalanche current generated around the first transistor and shunted through the bulk region is greater than a second avalanche current generated around the second transistor and shunted through the bulk region.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of operating a semiconductor device, comprising:
   - receiving the semiconductor device, the semiconductor device comprising:
     - a well region in a substrate;
     - a doped region in the substrate over the well region;
     - a plurality of gate electrodes disposed over the doped region and electrically coupled to each other;
     - a plurality of source regions in the substrate and electrically coupled together;
     - a plurality of drain regions in the substrate and electrically coupled together, wherein the plurality of gate electrodes, the plurality of source regions and the plurality of drain regions form a plurality of transistors, respectively; and
     - a bulk region disposed in the doped region at a periphery of the doped region,
     - wherein a first distance measured between a first transistor of the plurality of transistors and the bulk region is greater than a second distance measured between a second transistor of the plurality of transistors and the bulk region; and
   - applying a first voltage to the plurality of drain regions, wherein a first avalanche current generated around the first transistor and shunted through the first transistor is generated earlier than a second avalanche current generated around the second transistor and shunted through the second transistor.

2. The method of claim 1, wherein the well region includes a ring shape from a top-view perspective.

3. The method of claim 1, wherein the well region includes an N-type dopant.

4. The method of claim 1, further comprising stopping application of the first voltage to the plurality of drain regions, wherein a first leakage current of the semiconductor device free of application of the first voltage is substantially equal to a second leakage current of the semiconductor device before application of the first voltage.

5. The method of claim 1, wherein a first parasitic bipolar junction transistor (BJT) is formed of the doped region, a first drain region of the drain regions and a first source region of the source regions, wherein the first BJT is turned on to shunt the first avalanche current in response to the first voltage.

6. The method of claim 5, wherein a second parasitic BJT is formed of the doped region, a second drain region of the drain regions and a second source region of the source regions, wherein a first base resistance measured between the first parasitic BJT and ground is greater than a second base resistance measured between the second parasitic BJT and ground.

7. The method of claim 6, wherein the second parasitic BJT is turned off in response to the first voltage.

8. The method of claim 6, wherein the semiconductor device further comprises a resistor electrically coupling the bulk region to ground.

9. The method of claim 8, wherein the resistor is disposed in the substrate.

10. The method of claim 8, wherein the resistor is formed as a well-type resistor arranged in a second well region in the substrate.

11. The method of claim 1, wherein the well region laterally surrounds the plurality of transistors.

12. The method of claim 1, wherein the doped region is contiguous across the plurality of transistors.

13. A method of operating a semiconductor device, comprising:
   - receiving the semiconductor device, the semiconductor device comprising:
     - a well region in a substrate;
     - a doped region in the substrate over the well region;
     - a plurality of gate electrodes disposed over the doped region and electrically coupled to each other;
     - a plurality of source regions in the substrate and electrically coupled together;
     - a plurality of drain regions in the substrate and electrically coupled together, wherein the plurality of gate electrodes, the plurality of source regions and the plurality of drain regions form a plurality of transistors, respectively; and
     - a bulk region disposed in the doped region at a periphery of the doped region,
     - wherein a first distance measured between a first transistor of the plurality of transistors and the bulk region is greater than a second distance measured between a second transistor of the plurality of transistors and the bulk region;

measuring a first leakage current of the semiconductor device;

applying a first voltage to the plurality of drain regions to cause a first avalanche current to occur in a first parasitic bipolar junction transistor corresponding to the first transistor earlier than a second parasitic bipolar junction transistor corresponding to the second transistor; and stopping application of the first voltage to the plurality of drain regions and measuring a second leakage current of the semiconductor device, wherein the second leakage current is substantially equal to the first leakage current.

14. The method of claim 13, wherein the applying of the first voltage to the plurality of drain regions causes a second avalanche current to occur around the second transistor, wherein the first avalanche current occurs earlier than the second avalanche current.

15. The method of claim 13, wherein the bulk region has an N-type dopant.

16. The method of claim 13, wherein the well region extends below the doped region.

17. A semiconductor device, comprising:

a well region in a substrate;

a doped region in the substrate over the well region;

a plurality of gate electrodes disposed over the doped region and electrically coupled to each other;

a plurality of source regions in the substrate and electrically coupled together;

a plurality of drain regions in the substrate and electrically coupled together, wherein the plurality of gate electrodes, the plurality of source regions and the plurality of drain regions form a plurality of transistors, respectively; and a bulk region disposed in the doped region at a periphery of the doped region, wherein a first distance measured between a first transistor of the plurality of transistors and the bulk region is greater than a second distance measured between a second transistor of the plurality of transistors and the bulk region, wherein when the semiconductor device is configured to receive a first voltage at the plurality of drain regions to generate an avalanche current, a first avalanche current generated around the first transistor and shunted through the first transistor is generated earlier than a second avalanche current generated around the second transistor and shunted through the second transistor.

18. The semiconductor device of claim 17, wherein the doped region is surrounded by the well region from a lateral side and a lower side of the doped region.

19. The semiconductor device of claim 17, further comprising a first resistor formed in the substrate and electrically coupling the bulk region to ground.

20. The semiconductor device of claim 17, further comprising a first parasitic bipolar junction transistor (BJT) formed of the doped region, a drain region of the first transistor and a source region of the first transistor.

* * * * *